US006995495B2

(12) United States Patent
Ko et al.

(10) Patent No.: US 6,995,495 B2
(45) Date of Patent: Feb. 7, 2006

(54) 2-D ACTUATOR AND MANUFACTURING METHOD THEREOF

(75) Inventors: Young-chul Ko, Kyungki-do (KR); Jin-ho Lee, Kyungki-do (KR)

(73) Assignee: Samsung Electronics Co., Ltd., Suwon (KR)

(*) Notice: Subject to any disclaimer, the term of this patent is extended or adjusted under 35 U.S.C. 154(b) by 148 days.

(21) Appl. No.: 10/685,800

(22) Filed: Oct. 16, 2003

(65) Prior Publication Data

US 2004/0081391 A1    Apr. 29, 2004

(30) Foreign Application Priority Data

Oct. 18, 2002   (KR) .................... 10-2002-63853

(51) Int. Cl.
*H02N 1/00*     (2006.01)
*G02B 26/08*    (2006.01)
*G02B 26/10*    (2006.01)

(52) U.S. Cl. .................... 310/309; 359/224; 359/291
(58) Field of Classification Search ................ 310/309; 359/223–226, 290, 291
See application file for complete search history.

(56) References Cited

U.S. PATENT DOCUMENTS

| | | | | |
|---|---|---|---|---|
| 4,598,585 | A  * | 7/1986  | Boxenhorn    | 73/504.12 |
| 5,025,346 | A    | 6/1991  | Tang et al.  | 361/283   |
| 5,959,760 | A  * | 9/1999  | Yamada et al.| 359/224   |
| 6,636,339 | B2 * | 10/2003 | Lee          | 359/202   |
| 6,724,509 | B2 * | 4/2004  | Lee          | 359/201   |
| 6,753,638 | B2 * | 6/2004  | Adams et al. | 310/309   |
| 6,781,279 | B2 * | 8/2004  | Lee et al.   | 310/309   |
| 6,806,992 | B2 * | 10/2004 | Soneda et al.| 359/291   |
| 6,817,725 | B2 * | 11/2004 | Mizuno et al.| 359/877   |
| 6,822,776 | B2 * | 11/2004 | Hah et al.   | 359/224   |
| 6,881,649 | B2 * | 4/2005  | Kouma et al. | 438/460   |

(Continued)

FOREIGN PATENT DOCUMENTS

JP         05054782   *   3/1993

(Continued)

OTHER PUBLICATIONS

Schenk et al, "A resonantly excited 2D-micro-scanning-mirrow with large deflection", *Sensors and Actuartors* A89, pp. 104-111 (2001), Elseviere Science B.V.

(Continued)

*Primary Examiner*—Karl I Tamai
(74) *Attorney, Agent, or Firm*—Buchanan Ingersoll PC

(57) ABSTRACT

An actuator includes a stage having a first direction and a second direction perpendicular to the first direction and seesawing around a third direction perpendicular to the first direction and the second direction with respect to a rotation center axis placed along the first direction. A first support portion supports a seesaw motion of the stage. A base facing the stage under the stage at a predetermined interval is supported by the first support portion. A stage driving portion has a plurality of first driving comb electrodes and a plurality of first stationary comb electrodes corresponding to the first driving comb electrodes which are respectively formed on a lower surface of each of the stages and an upper surface of the base facing the stages. A second support portion supports the first support portion so that the first support portion seesaws with respect to a rotation center axis placed along the second direction. A first support portion driving portion has a second driving comb electrode provided at the first support portion and a second stationary comb electrode fixedly positioned to correspond to the second driving comb electrode to generate a seesaw motion of the first support portion.

28 Claims, 36 Drawing Sheets

U.S. PATENT DOCUMENTS

2002/0159170 A1 * 10/2002 Tsuboi et al. ................ 359/872
2004/0081391 A1 *  4/2004 Ko et al. ....................... 385/18
2005/0088720 A1 *  4/2005 Ko et al. ..................... 359/291

FOREIGN PATENT DOCUMENTS

JP          2000-147419    *  5/2000

OTHER PUBLICATIONS

Schenk et al, "Large Deflection Micromechanical Scanning Mirrors for Linear Scans and Pattern Generation", *IEEE Journal of Selected Topics in Quantum Electronics*, vol. 6, No. 5, pp. 715-722 (2000), IEEE.

* cited by examiner

DFR film coating & patterning on the Pyrex glass

500um SOI wafer

PR coating and patterning

Silicon dry etching by ICPRIE & PR removing

Oxidation

Si₃N₄ deposition

PR coating and patterning

Si₃N₄ & SiO₂ dry etching

Si dry etching by ICPRIE & Buried SiO₂ dry etching by RIE

PR removing & Au/Cr deposition for electrical connection

PR coating & Au/Cr wet etching

PR removing

Au/Cr wet etching & PR removing

Si₃N₄ deposition on the glass wafer

PR coating & patterning

Si₃N₄ dry etching

Glass wet etching

PR removing

PR coating & patterning on the silicon wafer

Silicon dry etching by ICPRIE & PR removing

Anodic bonding

DFR film coating & patterning

Glass etching by sand blustering

DFR film removing & Silicon wafer CMP

SiO₂ deposition & PR coating and patterning

SiO₂ dry etching & PR removing

PR coating & patterning

SiO₂ wet etching

Si dry etching by ICPRIE

PR removing

PR coating & patterning

Au/Cr deposition

PR removing (Au/Cr lift off)

Si dry etching by ICPRIE

SiO₂ wet etching

2-D ACTUATOR AND MANUFACTURING METHOD THEREOF

BACKGROUND OF THE INVENTION

This application claims the priority of Korean Patent Application No. 2002-63853 filed on Oct. 18, 2002 in the Korean Intellectual Property Office, the disclosure of which is incorporated herein in its entirety by reference.

1. Field of the Invention

The present invention relates to an MEMS (micro-electro-mechanical system) actuator and a method of manufacturing the same, and more particularly, to a 2-D MEMS actuator and a method of manufacturing the same.

2. Description of the Related Art

An MEMS actuator applied to an optical scanner includes a micro-mirror that moves in one direction or two directions by an electrostatic force.

U.S. Pat. No. 5,025,346 discloses a microactuator using an electrostatic effect obtained by a comb-typed electrode. The microactuator has a structure in which a movable comb electrode and a stationary comb electrode are alternately arranged at a movable structure and a stationary structure. The movable structure is suspended by a nearby support structure. The suspended structure is driven at a horizontal resonant frequency.

The conventional microactuator has a structure in which a driving movable comb electrode is formed parallel to a plane of a stage or a movable structure, and a stationary comb electrode corresponding to the driving comb electrode is alternately arranged with the driving comb electrode in a fixed state and parallel to a plane direction of the stage, like the driving comb electrode. In the conventional microactuator, since the comb electrode is provided around the stage, the overall size of the microactuator considerably increases compared to the stage or movable structure. As a result, the conventional actuator is limited in its application.

In the meantime, a bi-axes driving actuator having a structure in which one axis driving structure is supported by a second seesaw mechanical structure has been suggested (Harald Schenk, Sensors and Actuators A 89 (2001), pp. 104–111, and IEEE Journal of Selected Topics in Quantum Electronics, vol. 6, no. 5 (2000) pp. 715–722).

The bi-axes driving actuator is an extended application of one axis driving actuator and has a structure in which a stationary comb electrode and a driving comb electrode to drive a first axis and a stationary comb electrode and a driving comb electrode to drive a second axis are all disposed on a plane. Thus, the arrangement structure of the comb electrodes as in the first axis driving actuator greatly limits an effective area of a stage for optical scanning. Also, since the above bi-axes driving actuator is a resonant scanner which moves continuously, a static mirror positioning is not possible so that a linear driving is impossible.

Also, since the driving comb electrode and the stationary comb electrode are arranged on a plane such as a stage or a frame, a symmetrical electric field is generated between the driving comb electrode and the stationary comb electrode so that a driving force to induce driving of the stage cannot be obtained. Therefore, an additional starting electrode to generate asymmetrical electric field is needed for driving the stage. Also, since one stage is provided at one scanner, the bi-axes driving actuator is difficult to be applied to a laser television requiring a reflection surface of a sufficient size. Although it is need to arrange a plurality of mirror plates in an array form for a driving speed of 10 KHz or more required in a laser television while having a sufficient reflection surface over 1×1 mm$^2$, a plurality of mirror plates cannot be arranged in the scanner suggested by Harald Schenk.

SUMMARY OF THE INVENTION

To solve the above and/or other problems, the present invention provides a bi-axes driving actuator having a reflection surface of a large area and capable of high speed driving by an efficient arrangement of a comb electrode, and a method of manufacturing the same.

The present invention provides an actuator capable of driving a linear reflection surface in the entire operation [section](range), and a method of manufacturing the same.

The present invention provides a bi-axes actuator capable of initial driving without a starting electrode and electrically being separated and controlled, and a method of manufacturing the same.

According to one aspect of the present invention, an actuator comprises a stage having a first direction and a second direction perpendicular to the first direction and seesawing around a third direction perpendicular to the first direction and the second direction with respect to a rotation center axis placed along the first direction, a first support portion supporting a seesaw motion of the stage, a base facing the stage under the stage at a predetermined interval and supported by the first support portion, a stage driving portion having a plurality of first driving comb electrodes and a plurality of first stationary comb electrodes corresponding to the first driving comb electrodes which are respectively formed on a lower surface of each of the stages and an upper surface of the base facing the stages, a second support portion supporting the first support portion so that the first support portion seesaws with respect to a rotation center axis placed along the second direction, and a first support portion driving portion having a second driving comb electrode provided at the first support portion and a second stationary comb electrode fixedly positioned to correspond to the second driving comb electrode to generate a seesaw motion of the first support portion.

According to another aspect of the present invention, an actuator comprises a stage array in which a plurality of stages are arranged parallel to one another, the stage having a first direction and a second direction perpendicular to the first direction and seesawing around a third direction perpendicular to the first direction and the second direction with respect to a rotation center axis placed along the first direction, a first support portion supporting the stage array to enable a seesaw motion of each stage, a base facing the stages under the stage array at a predetermined internal and supported by a the first support portion, a stage driving portion having a first driving comb electrode and a first stationary comb electrode corresponding to the first driving comb electrode which are respectively formed on a lower surface of the stage and an upper surface of the base facing the stage, a second support portion supporting the first support portion so that the first support portion seesaws with respect to a rotation center axis placed along the second direction, and a first support portion driving portion having a second driving comb electrode provided at the first support portion and a second stationary comb electrode fixedly positioned to correspond to the second driving comb electrode to generate a seesaw motion of the first support portion.

The first support portion comprises a pair of first torsion bars respectively extending from both sides of the stage in the first direction and parallel to each other, and a rectangular edge type movable frame having a pair of first portions parallel to each other, to which the first torsion bars are connected, and a pair of second portions extending in the second direction and parallel to each other.

The second support portion comprises a pair of second torsion bars respectively extending from the second portion of the first support portion in the second direction, and a rectangular edge type stationary frame having a pair of first portions parallel to each other, to which the second torsion bars are connected, and a pair of second portions extending in the second direction and parallel to each other.

In the stage driving portion, the first driving comb electrode formed on a lower surface of the stage and the first stationary comb electrode formed on the base are parallel to each other in the third direction and extend alternately.

The first support portion driving portion comprises a second driving comb electrode extending in the first direction from each of the first portion of the first support portion, and a stationary comb electrode formed on the first portion of the second support portion alternately arranged with the second driving comb electrode.

The second driving comb electrode and the second stationary comb electrode are arranged deviating from each other in the third direction to form an asymmetrical electric field in the third direction.

The movable frame includes the second portion movable frame at the base's side and the first portion movable frame above the second portion movable frame. The second driving comb electrode extends from the first portion movable frame The stationary frame comprises a first portion stationary frame and a second portion stationary frame at a lower portion of the first portion stationary frame, and the second stationary comb electrode corresponding to the second driving comb electrode extends from the first portion stationary frame.

The first torsion bars are integrally formed with the stage and the first portion movable frame, and the second torsion bars are integrally formed with the movable frame and the first portion stationary frame.

BRIEF DESCRIPTION OF THE DRAWINGS

The above features of the present invention will become more apparent by describing in detail preferred embodiments thereof with reference to the attached drawings in which.

DETAILED DESCRIPTION OF THE INVENTION

Figure 1:
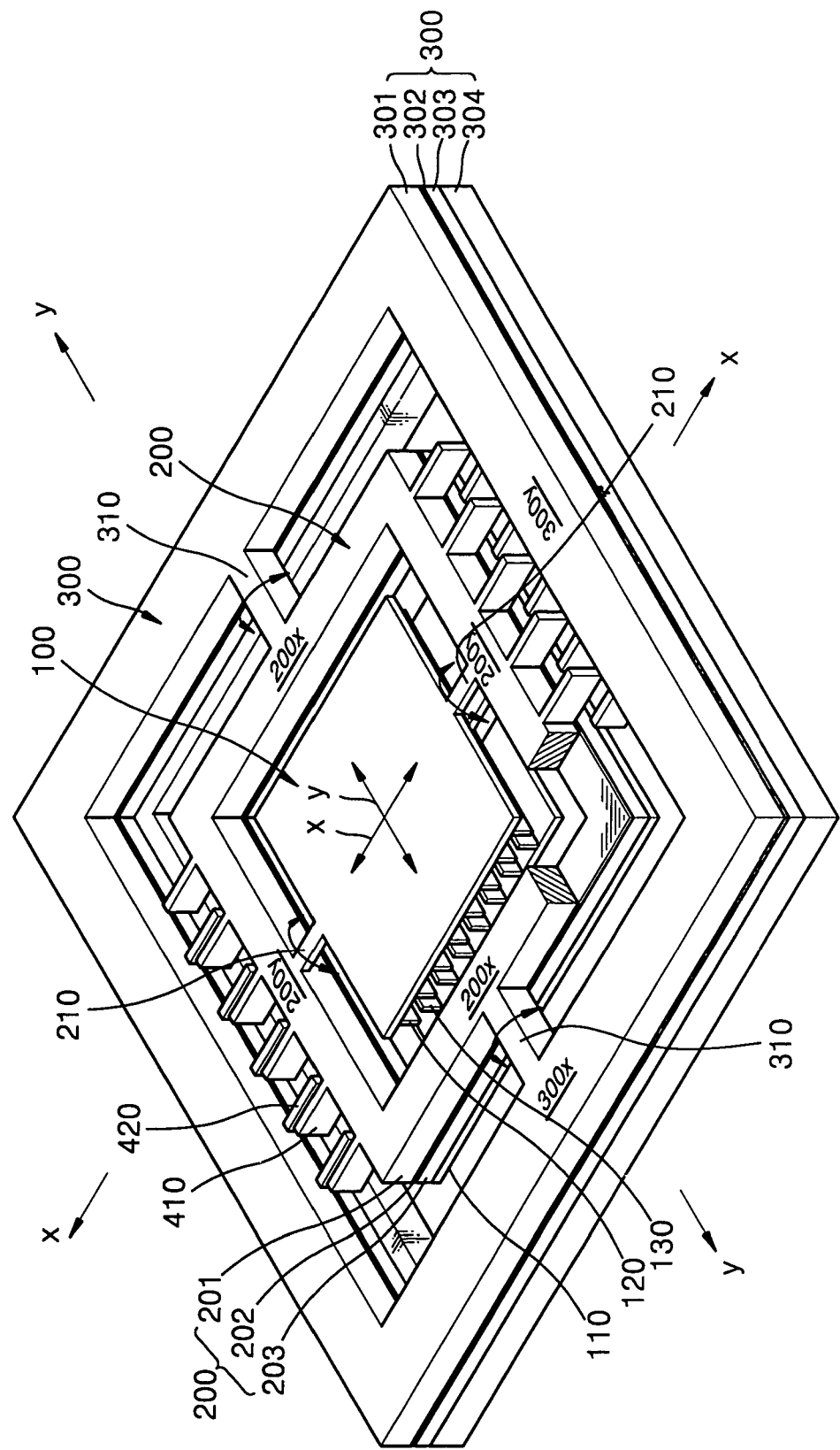
FIG. 1 is a perspective view illustrating an actuator according to a first preferred embodiment of the present invention.

In the following description of the present invention, the sizes of constituent elements shown in the drawings may be exaggerated, if needed, or sometime the elements may be omitted for a better understanding of the present invention. However, such ways of description do not limit the scope of the technical concept of the present invention.

<Preferred Embodiment 1>

Figure 2:
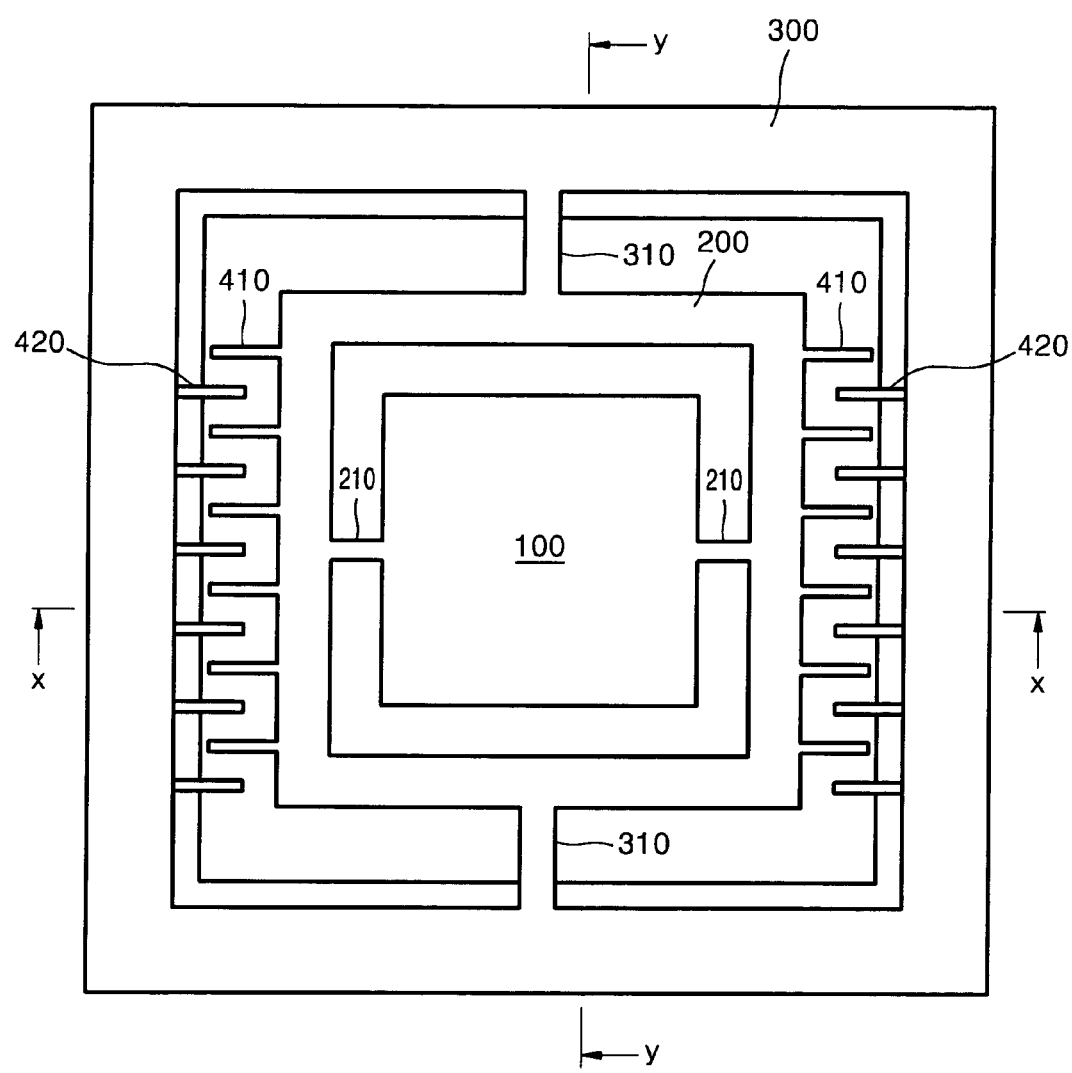
FIG. 2 is a plan view of the actuator of FIG. 1.

Referring to FIGS. 1 and 2, a stage 100 having a mirror (not shown) formed on a surface thereof is supported by a first support portion including a first torsion bar 210 and a rectangular edge type movable frame 200, capable of seesawing with respect to a center axis x—x in a first direction. The first support portion supporting the stage 100 is supported by a second support portion including a second torsion bar 310 and a rectangular edge type stationary frame 300, capable of seesawing with respect to a center axis y—y in a second direction. Accordingly, the stage 100 is supported capable of moving in bi-axes directions by the first and second support portions.

The stage 100 having the first direction x and the second direction y is connected to the rectangular edge type movable frame 200 by the two first torsion bars 210 and 210 extending to the first direction x. Thus, the stage 100 is supported capable of seesawing with respect to the center axis x—x in the first direction by the first torsion bars 210 and 210 located at both sides thereof. The rectangular edge type movable frame 200 has a first portions 200y parallel to the y—y axis and where the torsion bar 210 is connected to the middle portion thereof, and a second portion 200x parallel to the x—x axis and where the torsion bar 310 is connected to the middle portion thereof. The rectangular edge type stationary frame 300 is provided outside the rectangular edge type movable frame 200 to encompass the same and includes a first portion 300y extending in the first direction x and a second portion 300x extending in the second direction y. The stationary frame 300 and the movable frame 200 are connected to the second torsion bar 310 located at the middle portion between the respective second portions 200x and 300x. The second torsion bar 310 extends in the second direction y and thus the movable frame 200 is supported capable of seesawing with respect to the center axis y—y in the second direction.

Figure 3:
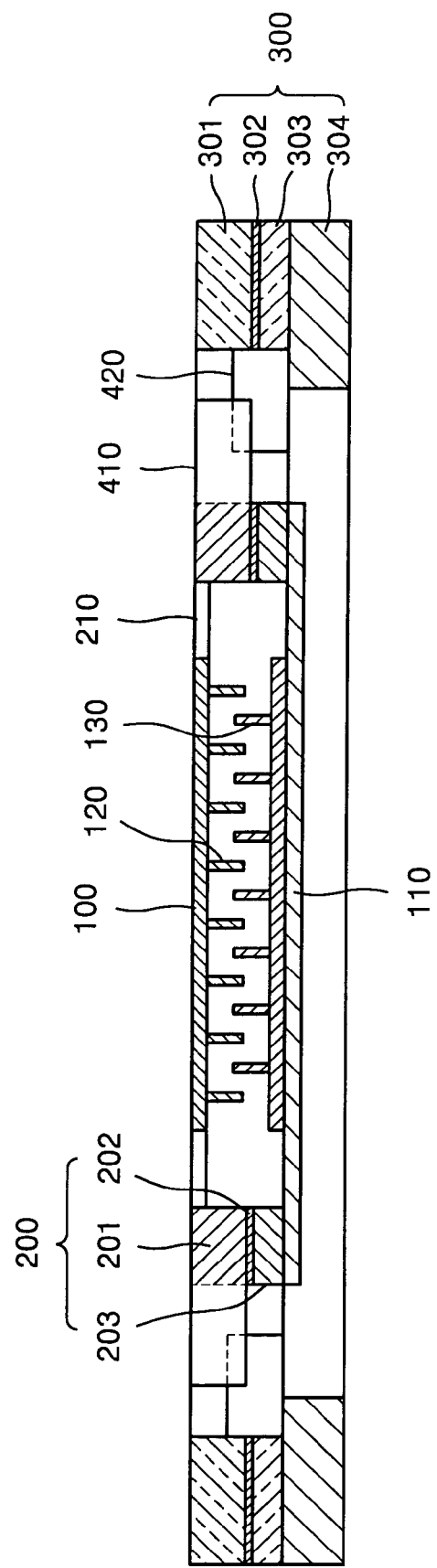
FIG. 3 is a sectional view taken along line x—x of FIG. 2.

As shown in FIGS. 1 and 3, the movable frame 200 and the stationary frame 300 have a multilayered structure having multiple layers 201, 202, and 203, and 301, 302, 303, and 304. The multilayered structure cannot be obtained from a single base material so that the stage 100, the movable frame 200, and the stationary frame 300 are formed from the multiple layers 201, 203, 301, 303, and 304 obtained from SI, SOI, and a glass substrate. Reference numerals 202 and 302 denote a bonding layer, in detail, eutectic bonding layer, to bond upper and lower multiple layers 201 and 203, and 301 and 303. The multilayered structure will be understood through a description about a method of manufacturing an actuator according to the present invention. As it will be described in the description of the manufacturing method, the bonding layer bonds an upper structure and a lower structure constituting an actuator. Thus, the upper structure and the lower structure are separately manufactured and incorporated in the final step.

Figure 4:
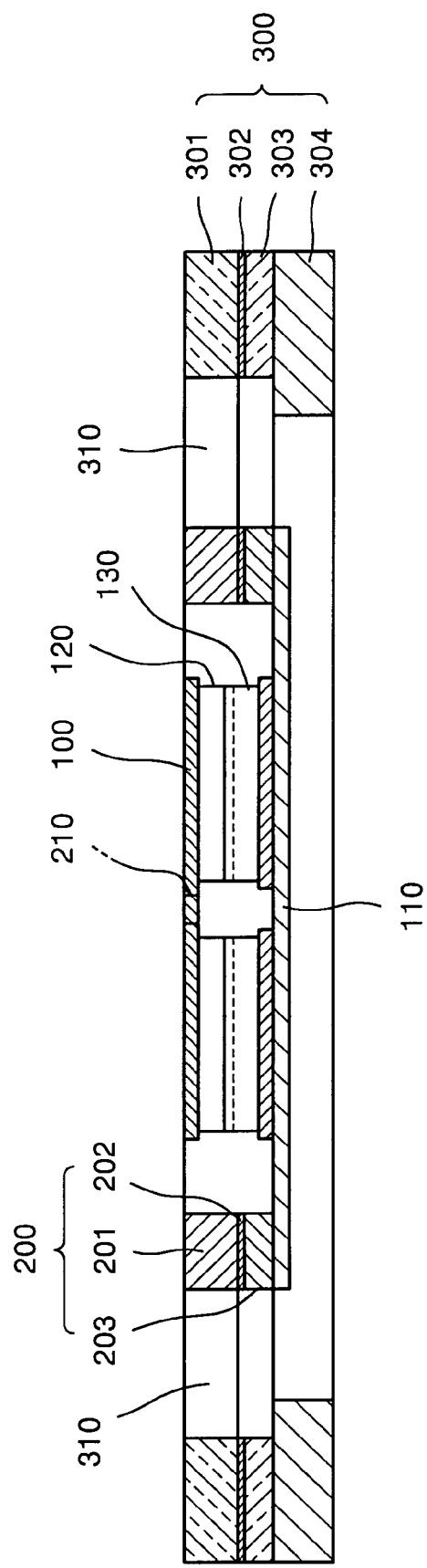
FIG. 4 is a sectional view taken along line y—y of FIG. 3.

As a characteristic feature of the present invention, a stage driving portion generating the seesaw motion of the stage 100, as shown in FIG. 3, is provided by a first driving comb electrode 120 formed on a lower surface of the stage 100 and a second stationary comb electrode 130 formed on a base 110 thereunder. As shown in FIG. 4 which is a section view taken along line y—y of FIG. 3, the first driving comb electrode 120 is arranged on a lower surface of the stage 100 at both sides with respect to the first torsion bar 210 which is a rotation axis of the stage 100 while the second stationary comb electrodes 130 is arranged on the base 110 corresponding to the first driving comb electrode 120.

A movable frame driving portion making the stage 100 and the movable frame 200 seesaw with respect to a center axis in the y direction is provided between the movable frame 200 and the stationary frame 300. As shown in FIGS. 1 and 2, a second driving comb electrode 410 and a second stationary comb electrode 420 are alternately arranged at the side surfaces of the first portion 200y of the movable frame 200 and the first portion 300y of the stationary frame 300 facing the first portion 200y, respectively. As another characteristic feature of the present invention, the second driving comb electrode 410 and the second stationary comb electrode 420 are displaced deviating from each other in a third direction z perpendicular to a plane of the stage 100, that is, in a direction along which the movable frame 200 moves with respect to the second torsion bar 310. The displacement of the electrodes generates an electrostatic force therebetween in a third direction by an asymmetrical electric field in the third direction z between the electrodes. Thus, a seesaw type kinetic force of the movable frame 200 being coupled with the second driving comb electrode 410 and supported by the second torsion bar 310 is generated.

Another the technical feature of the actuator according to the present invention is that since the comb electrodes 120 and 130 driving the stage 100 are disposed under the stage 100, there is no additional space needed by the comb electrodes 120 and 130. Thus, the stage 100 can occupy the maximum area in the entire space.

A second preferred embodiment 2 described below is related to an actuator where a plurality of stages are arranged in an array form.

<Preferred Emobodiment 2>

Figure 5:
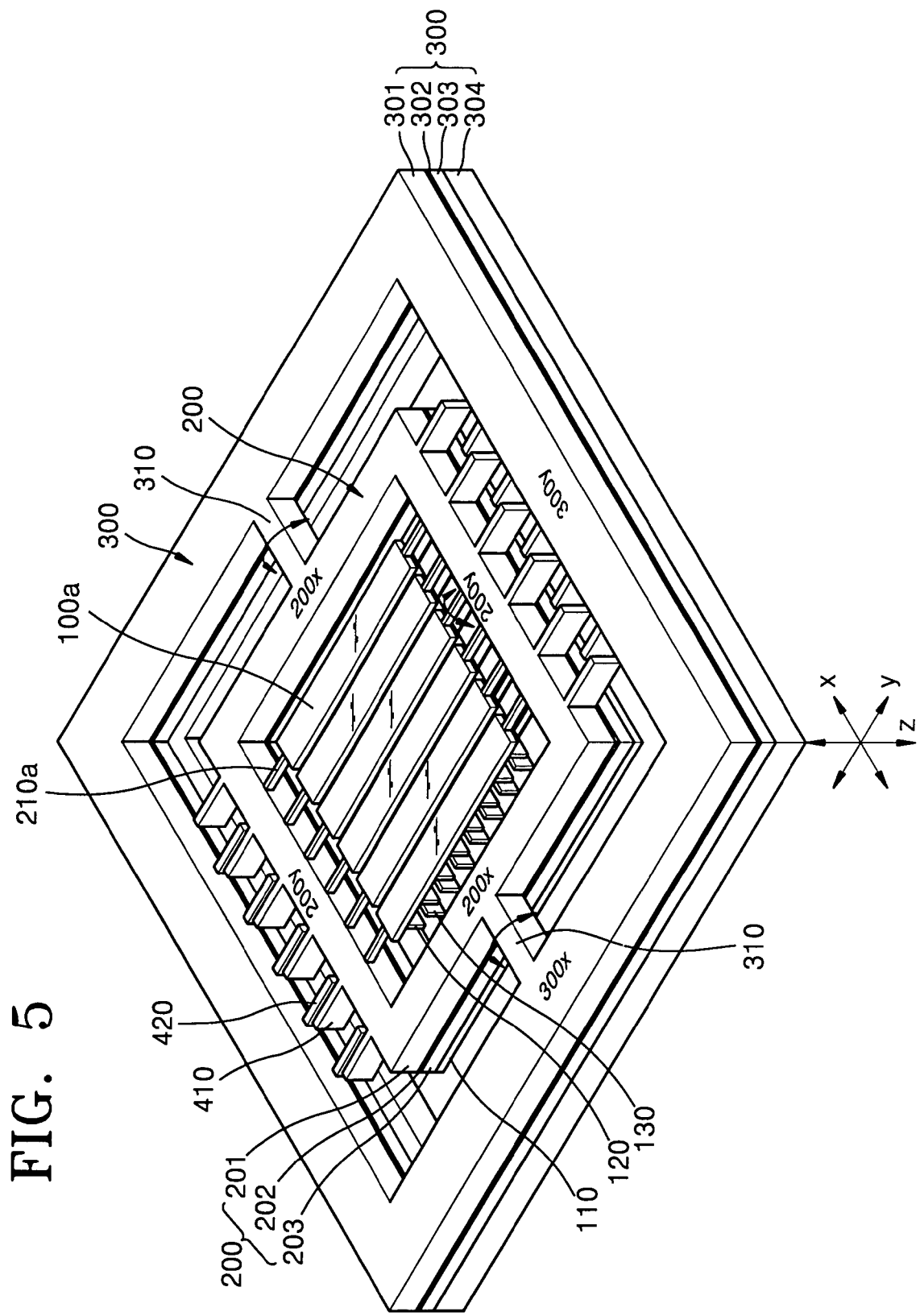
FIG. 5 is a perspective view illustrating an actuator according to a second preferred embodiment of the present invention.
Figure 6:
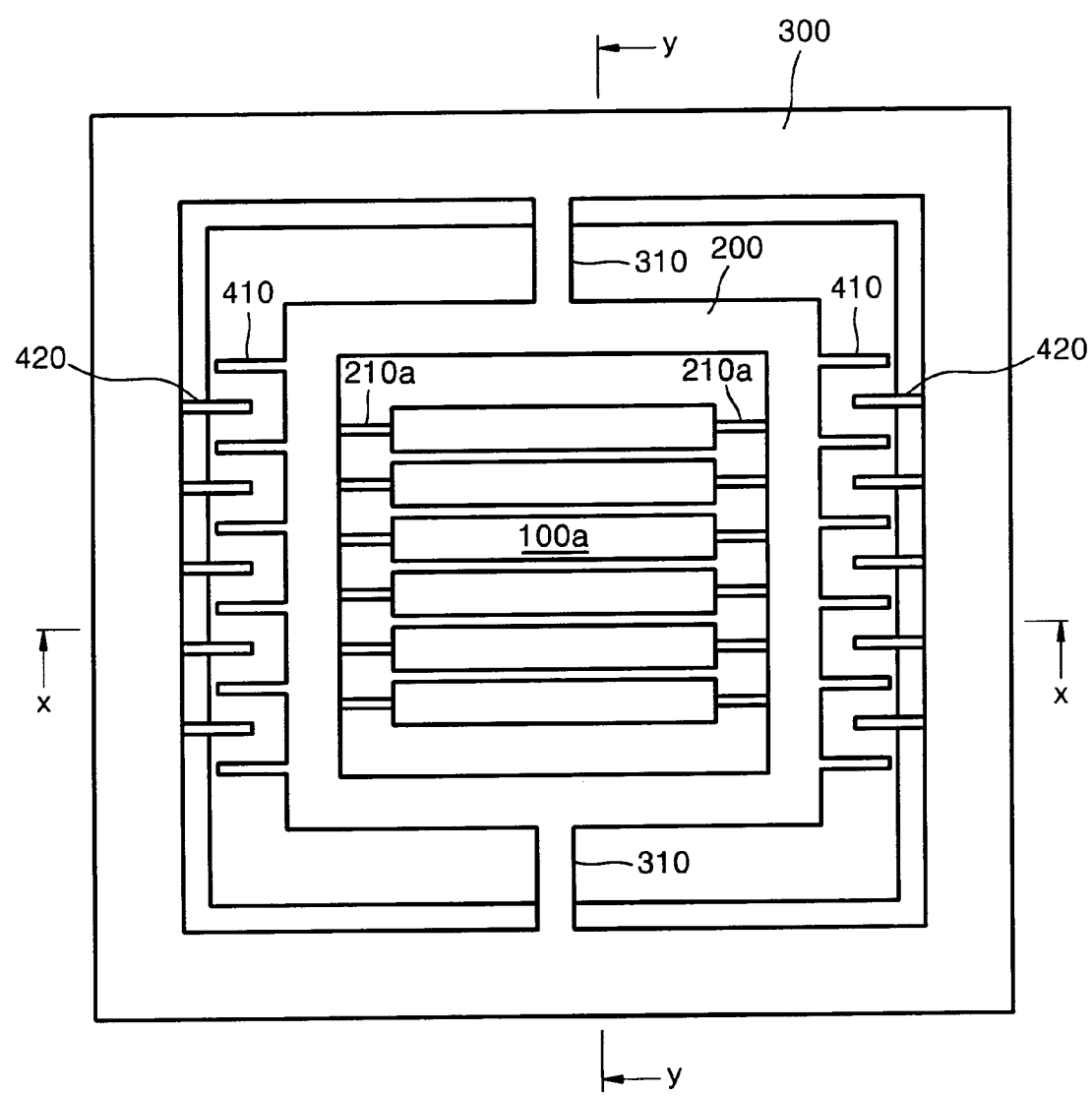
FIG. 6 is a plan view of the actuator of FIG. 5.
Figure 7:
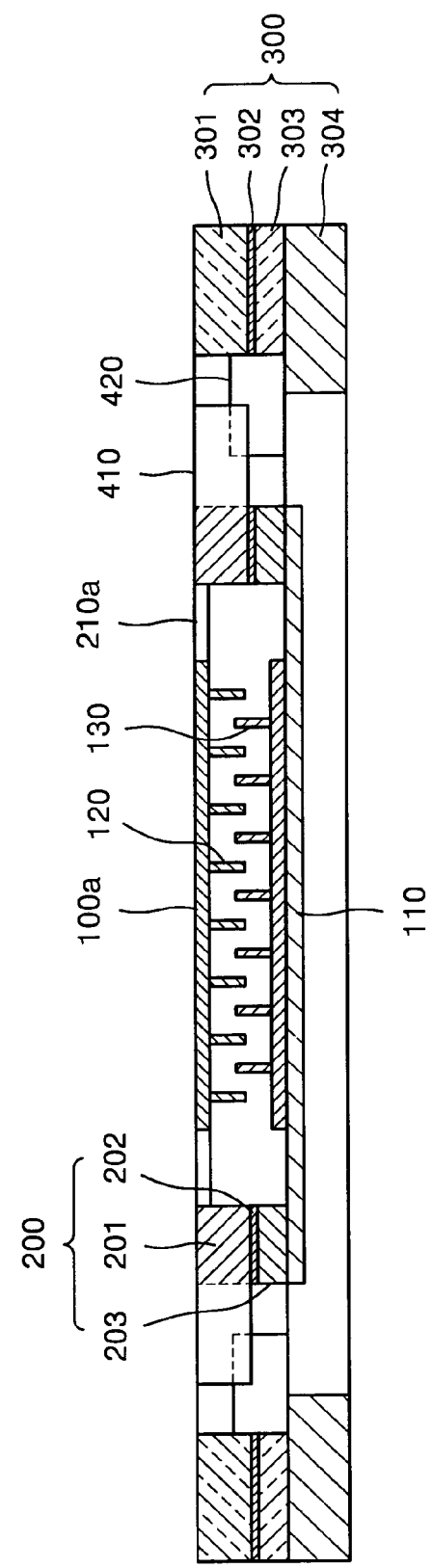
FIG. 7 is a horizontal sectional view of the actuator of FIG. 5.

FIG. 5 is a perspective view illustrating an actuator according to the present invention having an improved structure. FIG. 6 is a plan view of the actuator of FIG. 5. FIG. 7 is a sectional view taken along line x—x of FIG. 6.

Referring to FIGS. 5 and 6, a plurality of stages 100a where a mirror (not shown) is formed on a surface thereof are arranged in an array form and the stage array is encompassed by the rectangular edge type movable frame 200. A first torsion bar 210a constituting a first support portion with the rectangular edge type movable frame 200 is extended from both ends of each of the stages 100a. Thus, the stages 100a are supported by the first support portion capable of seesawing with respect to center axes $x_0$—$x_0$, . . . ,$x_n$—$x_n$ parallel to the first direction, respectively. Also, as described in the above first preferred embodiment, the first support portion supporting the stages 100a is supported by a second support portion including the second torsion bar 310 and the rectangular edge type stationary frame 300, capable of seesawing with respect to a center axis y—y in the second direction. Thus, the stages 100a are supported by the first and second support portions capable of moving in bi-axes directions.

In detail, each of the stages 100a having the first directions $x_0$-$x_n$ and the second direction y, parallel to one another, is connected to the rectangular edge type movable frame 200 by the two first torsion bars 210a extending in the first directions $x_0$-$x_n$. Thus, the stages 100a are supported by the first torsion bar 210a at both sides thereof capable of seesawing with respect to the center axes $x_0$—$x_0$, . . . , $x_n$—$x_n$ in the first direction. The rectangular edge type movable frame 200 supporting the stage array includes a first portion 200y extending parallel to the y—y axis and to which the first torsion bar 210a is connected and a second portion 200x extending parallel to the x—x axis and where the first torsion bar 210a is connected to the center thereof. The rectangular edge type movable frame 200 is encompassed by the rectangular edge type stationary frame 300 having a first portion 300y extending in the first direction and the second portion 300x extending in the second direction perpendicular to the first direction. The stationary frame 300 and the movable frame 200 are connected by the second torsion bar 310 disposed at the center portion between the respective second portions 200x and 300x. The second torsion bar 310 is extended in the second direction y so that the movable frame 200 can seesaw with respect to the center axis y—y in the second direction by the second torsion bar 310.

As in the first preferred embodiment, the movable frame 200 and the stationary frame 300 have a multilayered structure of multiple layers 201, 202, and 203, and 301, 302, 303, and 304, respectively. The multilayered structure will be described later in detail in the description on a manufacturing method.

Figure 8:
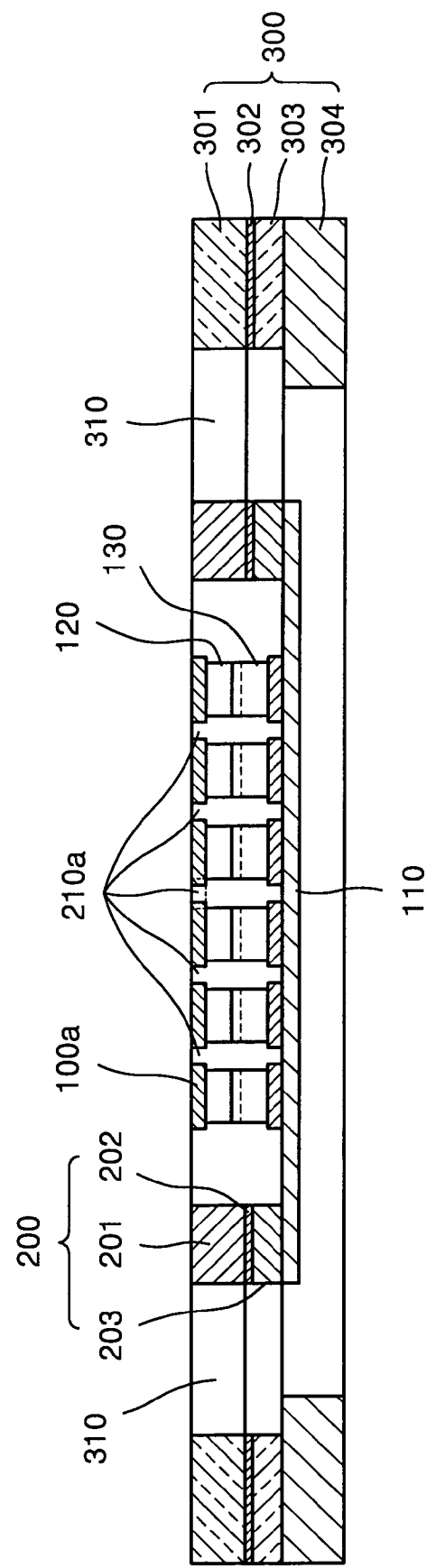
FIG. 8 is a vertical sectional view of the actuator of FIG. 5.

In the second preferred embodiment, a stage driving portion generating seesaw motions of the stages 100a, as shown in FIG. 7, includes the first driving comb electrode 120 formed on a lower surface of each of the stages 100a and the second stationary comb electrode 130 formed on the base 110 thereunder. As shown in FIG. 8 which is a section view taken along line y—y of FIG. 6, the first driving comb electrode 120 is arranged on the lower surface of each of the stages 100a at both sides with respect to the first torsion bar 210a which is a rotation axis of each of the stages 100a. The second stationary comb electrode 130 corresponding to the first driving comb electrode 120 of the stages 100a is arranged on the base 110 in an array form.

Meanwhile, a movable frame driving portion making the stages 100a and the movable frame 200 supporting the stages 100a seesaw with respect to the center axis in the y direction is provided between the movable frame 200 and the stationary frame 300. As shown in FIGS. 5 and 6, the second driving comb electrode 410 and the second stationary comb electrode 420 are alternately arranged at side surfaces of the first portion 200y of the movable frame 200 and the firs portion 300y of the stationary frame 300, facing each other. Thus, the respective stages 100a seesawing with respect to the axis in the first direction can seesaw at the same time with respect to the axis in the second direction by the movable frame 200. As another characteristic feature of the present invention, as in the first preferred embodiment, the second driving comb electrode 410 and the second stationary comb electrode are displaced deviating from each other in the third direction z perpendicular to a plane of the stages 100a, that is, in a direction along which the movable frame 200 moves with respect to the second torsion bar 310. The displacement of the electrodes generates an electrostatic force therebetween in the third direction z by an asymmetrical electric field in the third direction (a direction of a seesaw motion of the stages) between the electrodes. Thus, a seesaw type kinetic force of the movable frame 200 supported by the second torsion bar 310 is generated.

In the above-described first and second preferred embodiments, a sensing electrode having an opposed electrode structure like the stationary comb electrode and the driving comb electrode, as a sort of sensor detecting a movement of the stages 100 and 100a from a change in electric capacitance, not providing a driving force to the stages 100 and 100a, can be selectively provided on the low surfaces of the stages 100 and 100a and the upper surfaces of the base corresponding thereto.

Figure 9:
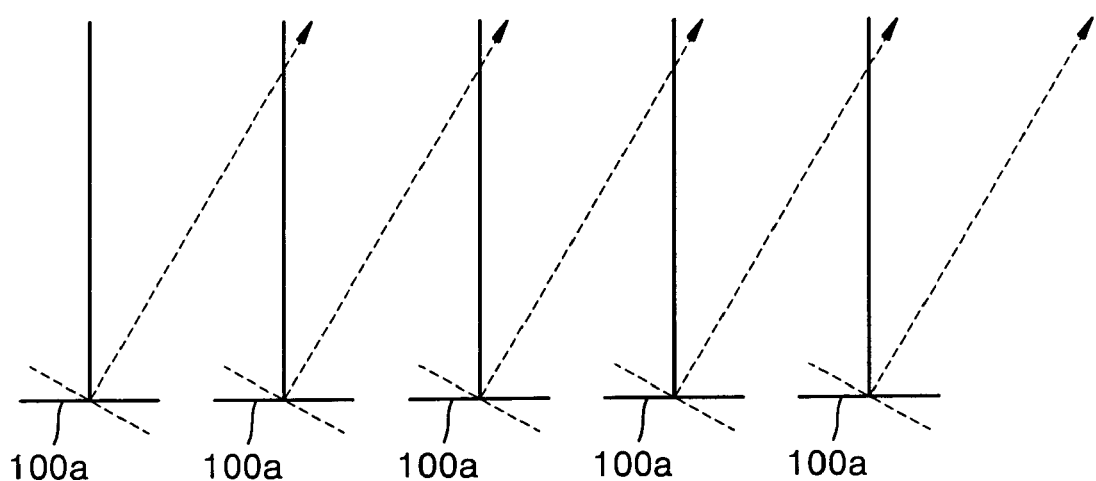
FIG. 9 is a view showing light reflection by the actuator of FIG. 5.

In the actuator according to the second preferred embodiment, as shown in FIG. 9, since a single incident beam on the stages 100a is reflected by the stages 100a which are simultaneously operated, the entire thickness of an optical scanner can be reduced compared to a structure in which an incident beam is reflected using a single stage, so that the weight of each stage can be remarkably reduced and a driving speed can be greatly increased.

Electric wiring structures of the stages and electrodes are not described or shown in the first and second preferred embodiments and the drawings attached hereto. However, in these structures, a wiring layer for electric wiring from the outside and a through hole for electric connection between layers are present. An electric path is mainly provided by silicon and the silicon forms a body of the respective structure. The electric paths to the stages 100 and 100a are torsion bars 210 and 210a made of silicon and, in a portion needing electrical separation and insulation, silicon is patterned and an insulation material is filled in the appropriate portion. Also, the through hole is filled with a conductive material for contact between layers through the through hole.

Figure 10:
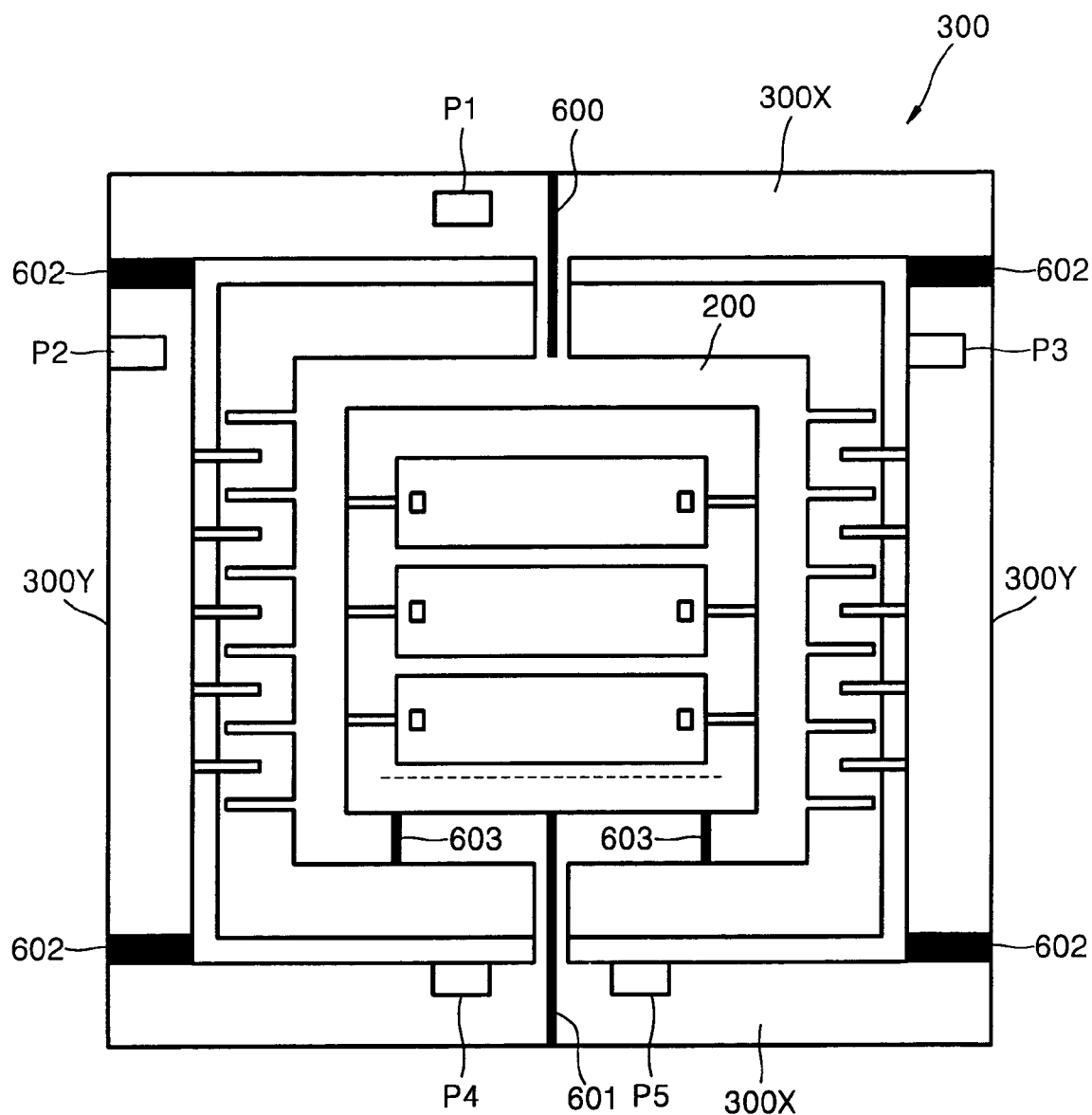
FIG. 10 is a diagram showing an electric circuit in the actuator according to the present invention.

In the first and second preferred embodiments, wiring of at least three paths are needed for the motions of the stages 100 and 100a. Three paths are needed for the motion of the movable frame 200. Here, when ground is maintained at the same electric potential, five electric paths are needed as a whole. FIG. 10 is a plan view illustrating an actuator according to the present invention for explaining an electric path of the actuator. In the drawing, a black portion 600 is an electric insulation layer or an insulation portion. Reference numerals P1, P2, P3, P4, and P5 are pads for wiring with an external circuit.

Referring to FIG. 10, the first pad P1 is provided at one side of the second portion 300x (at the upper side on the drawing) and connected to the second driving comb electrode 410 and the driving comb electrode 120 under the stage via the second torsion bar 310. The first pad P1 acts as a virtual ground. The second pads P2 and P3 are provided at the end sides of the first portion 300y of the stationary frame 300 electrically isolated by an insulation portion 602 in the stationary frame 300. Thus, an electric circuit for generating an electrostatic force between the second stationary comb electrode 420 and the second driving comb electrode 410. In the meantime, the fourth pad P4 and the fifth pad P5 are provided at the second portion 300x at one side of the stationary frame 300 (in the lower portion on the drawing) and electrically separated from the first portion 300y. Also, the fourth pad P4 and the fifth pad P5 are electrically separated by an insulation portion 601 crossing the second torsion bar 310 and connected to the movable frame 200 via the second torsion bar 310. The second portion 200x of the movable frame 200 where the fourth and fifth pads P4 and P5 are connected has a portion electrically separated by the insulation portion 601 at the center thereof and the insulation portion 603 at both end sides thereof. The portion where the fourth and fifth pads P4 and P5 are connected is connected by the first stationary comb electrodes 130 on the base 110 by the through hole and the conductive material filling the same.

The insulation portion 600 crossing the second torsion bar 310 in the upper portion on the drawing is inserted not to electrically separate the second torsion bar 310 but to make the second torsion bar in the same shape as the insulation portion 601 in the lower portion of the drawing.

A method of manufacturing an actuator according to a preferred embodiment of the present invention will be described below. In the present preferred embodiment, a method of manufacturing the actuator according to the second preferred embodiment of the present invention will be described. Through the description of the manufacturing method, the detailed structure of the actuator according to the second preferred embodiment will be more clearly understood. The constituent elements shown in FIGS. 5 through 10 are cited with reference numerals, if necessary.

1. Upper Structure Manufacturing Method

<<Manufacture of Holder>>

Figure 11A:
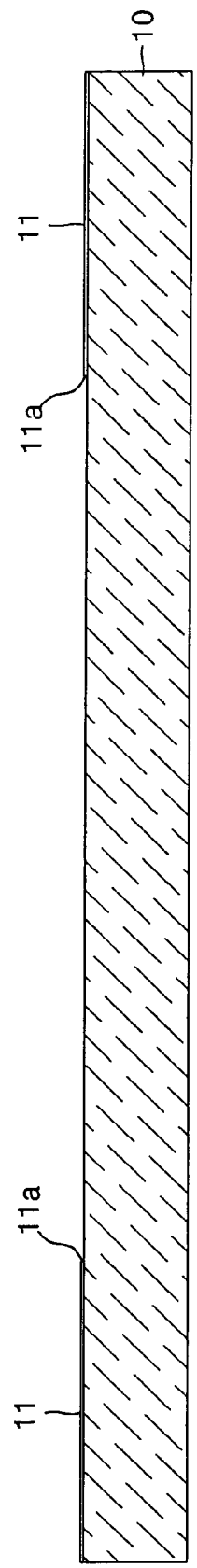
FIGS. 11A through 11C are views showing steps of manufacturing a holder for supporting an upper structure in a method of manufacturing the actuator according to the present invention.

As shown in FIG. 11A, a glass 10 is used as a material for a holder for fixing the actuator and a DFR (dry film resist) film 11 is coated on an upper surface of the Pyrex glass 10 and patterned. A window 11a to be opened has the size to be fixed when an edge portion of the stationary frame 300 of the actuator is put on the glass 10.

Figure 11B:
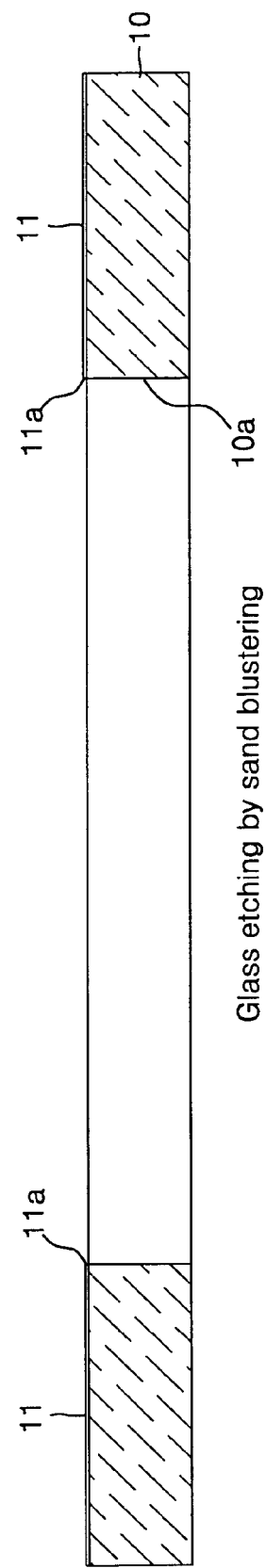
Figure 11C:
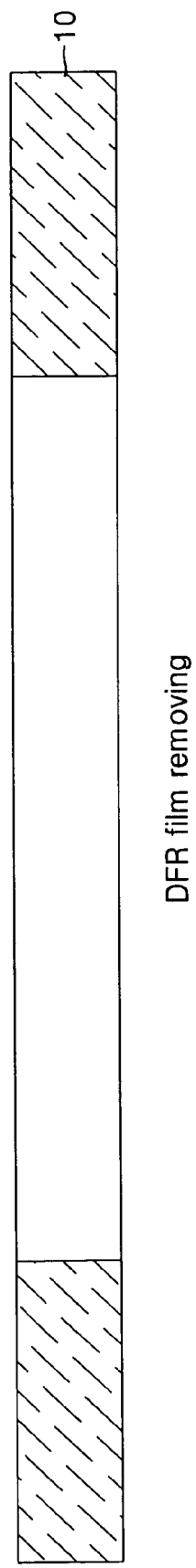

As shown in FIG. 11B, the exposed portion of the glass 10 which is not covered by the window 11a is etched by sand blasting. As shown in FIG. 11C, by removing the DFR film 11, a completed holder 10 having the window 10a of a predetermined pattern is obtained.

<<Manufacture of Main Body of Upper Structure>>

Figure 12A:
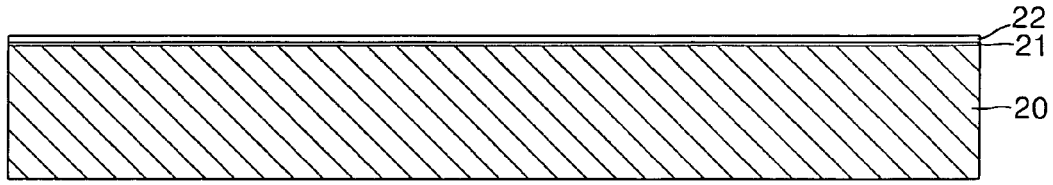
FIGS. 12A through 12K are views showing steps of manufacturing a main body of the upper structure in a method of manufacturing the actuator according to the present invention.

As shown in FIG. 12A, as a material for the upper structure, an SOI (silicon on insulator) wafer having a thickness of about 500 $\mu$m and where an $SiO_2$ film 21 is formed between an upper silicon film 22 and a lower silicon main body 20 to be used as an etch stop layer when the first and second driving comb electrodes are formed.

Figure 12B:
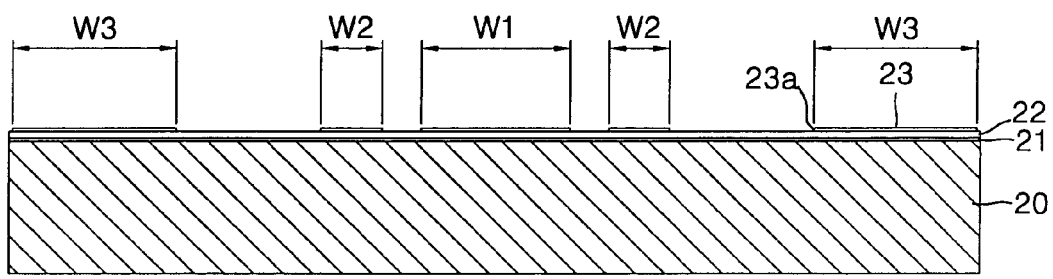

As shown in FIG. 12B, a photoresist mask 23 having a window of a predetermined pattern is formed on the silicon film 22. Here, the portion covered by the mask 23 includes an area W1 where the stage 100a is to be formed, an area W2 where the movable frame 200 is to be formed, an area W3 where the stationary frame 300 is to be formed, and an area (not shown) where the torsion bar is to be formed.

Figure 12C:
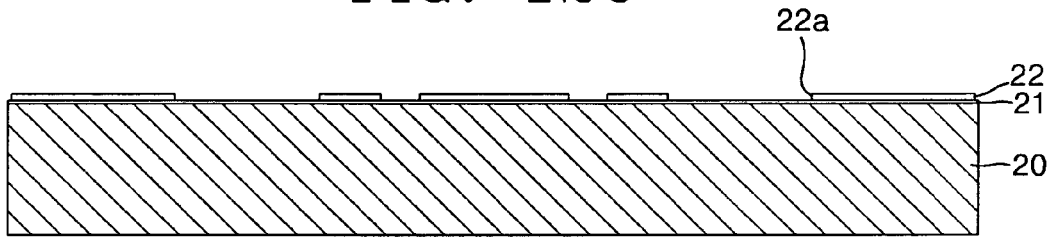

As shown in FIG. 12C, a portion on the silicon film 22 which is not covered by the photoresist mask 23 is etched in an ICPRIE (inductively coupled plasma reactive ion etching) method so that the insulation film (SiO$_2$ film) 21 is exposed through a window 23a of the photoresist mask 23. After etching is completed, the photoresist mask 23 is removed by stripping.

Figure 12D:
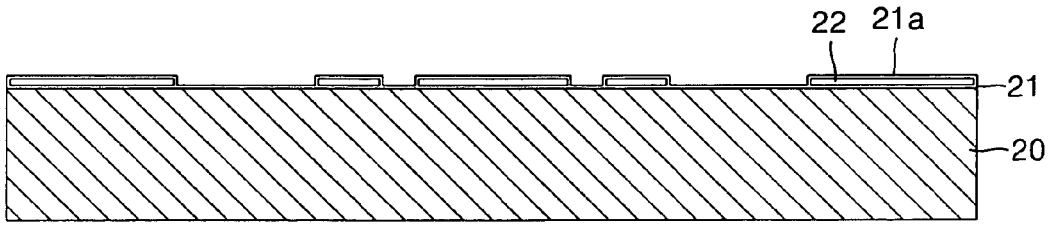

As shown in FIG. 12D, an SiO$_2$ insulation film 21a is formed on the silicon film 22 and the exposed insulation film 21 in a thermal oxidation method. Thus, the silicon film 22 at the upper side is completely isolated from the outside by the insulation film 21 at the lower side and the insulation film 21a at the upper side.

Figure 12E:
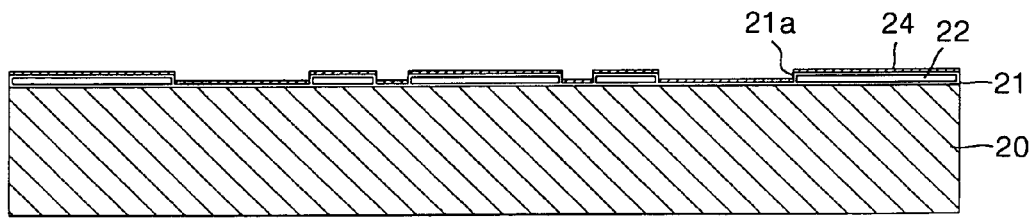

As shown FIG. 12E, an silicon nitride (Si$_3$N$_4$) film 24 is deposited on the insulation films 21 and 21a.

Figure 12F:
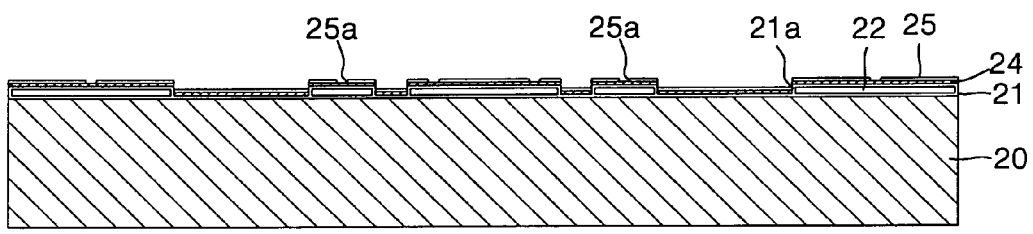

As shown in FIG. 12F, a photoresist mask 25 having a window 25a is formed on the nitride film 24. The window 25a is a pattern to form a through hole for electric connection. Thus, the window 25a is formed to a predetermined size and in a predetermined number, on the stage area W1, the movable frame area W2, and the stationary frame area W3.

Figure 12G:
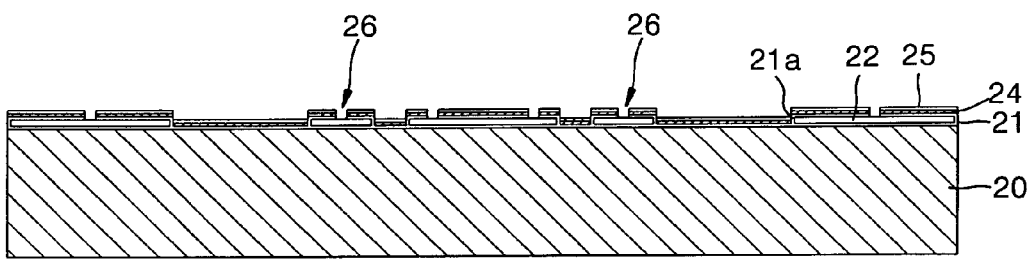
Figure 12H:
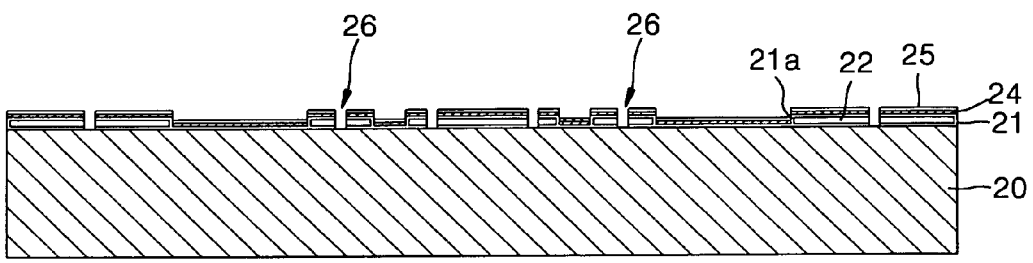

As shown in FIG. 12G, the portion exposed through the window 25a is etched in a dry etching method so that a through hole 26 in an initial form in which the surface of the silicon film 22 is exposed at the bottom of the through hole 26. Next, as shown in FIG. 12H, the silicon film 22 exposed at the bottom of the through hole 26 and the insulation film 21 thereunder are etched in an ICPRIE method. When the etching is completed, the photoresist mask 25 is removed.

Figure 12I:
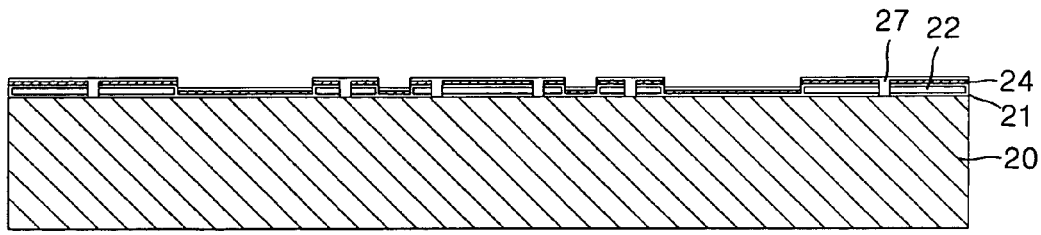

As shown in FIG. 12I, a conductive metal film for electric connection, for example, an Au/Cr film 27, is deposited on the entire top surface of the resultant product.

Figure 12J:
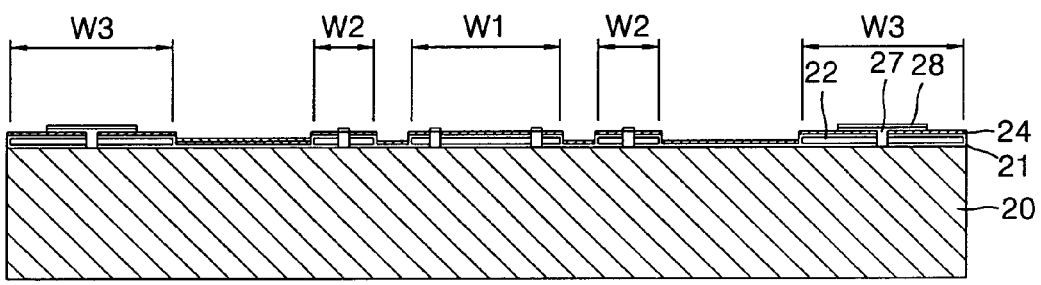

As shown in FIG. 12J, after the photoresist mask 28 is formed, the Au/Cr film 27 on the portion which is not covered by the photoresist mask 28 is removed so that Au/Cr film 27 remains only on a necessary portion. The portion where the Au/Cr film 27 remains, that is, a portion covered by the photoresist mask 28, is a portion corresponding to the through hole 26 in the stage area W1 and the movable frame area W2 and a portion to be used as the through hole 26 and the pads P1, P2, P3, and P5 in the stationary area W3.

Figure 12K:
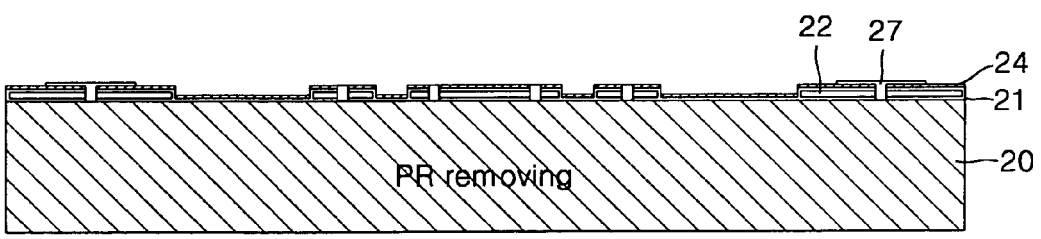

As shown in FIG. 12K, by removing the photoresist mask 28, a semi-processed main body of the upper structure obtained from the SOI wafer is obtained.

<<Bonding of Holder and Upper Structure Main Body and Subsequent Step>>

Figure 13A:
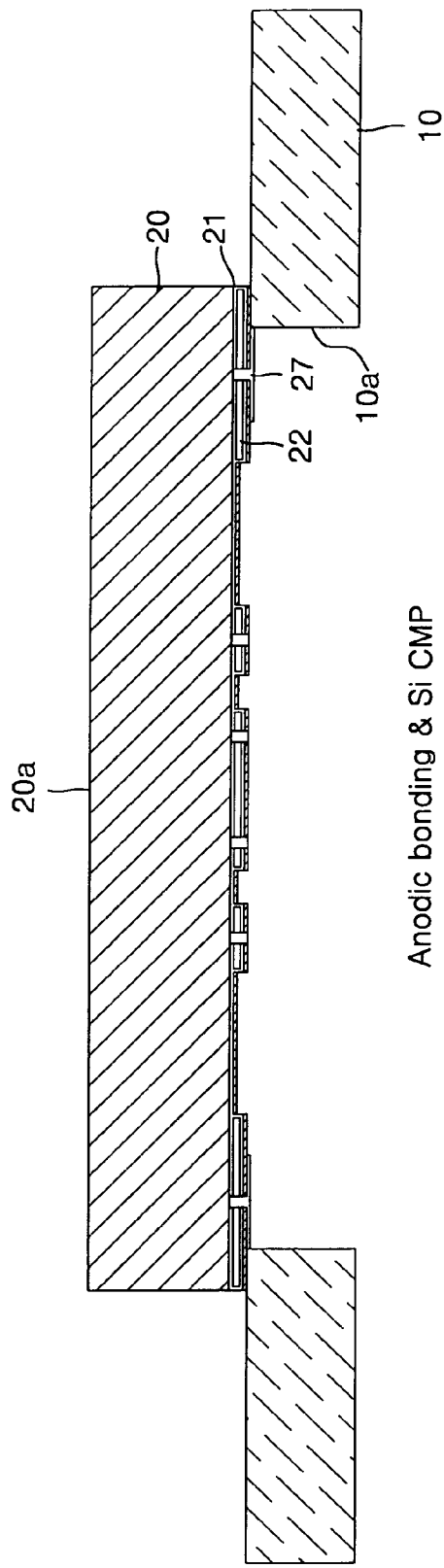
FIGS. 13A through 13K are views showing subsequent steps with respect to the upper structure after the main body of the upper structure is installed at the holder in a method of manufacturing the actuator according to the present invention.

As shown in FIG. 13A, the upper structure main body is installed on the holder 10 obtained from the above-described process. An anodic bonding is used herein and the bottom surface of the silicon main body 20 faces upward. A bottom surface 20a of the silicon main body 20 facing upward in a state in which the silicon main body 20 is installed on the holder 10 is grinded by a CMP (chemical mechanical polishing) method.

Figure 13B:
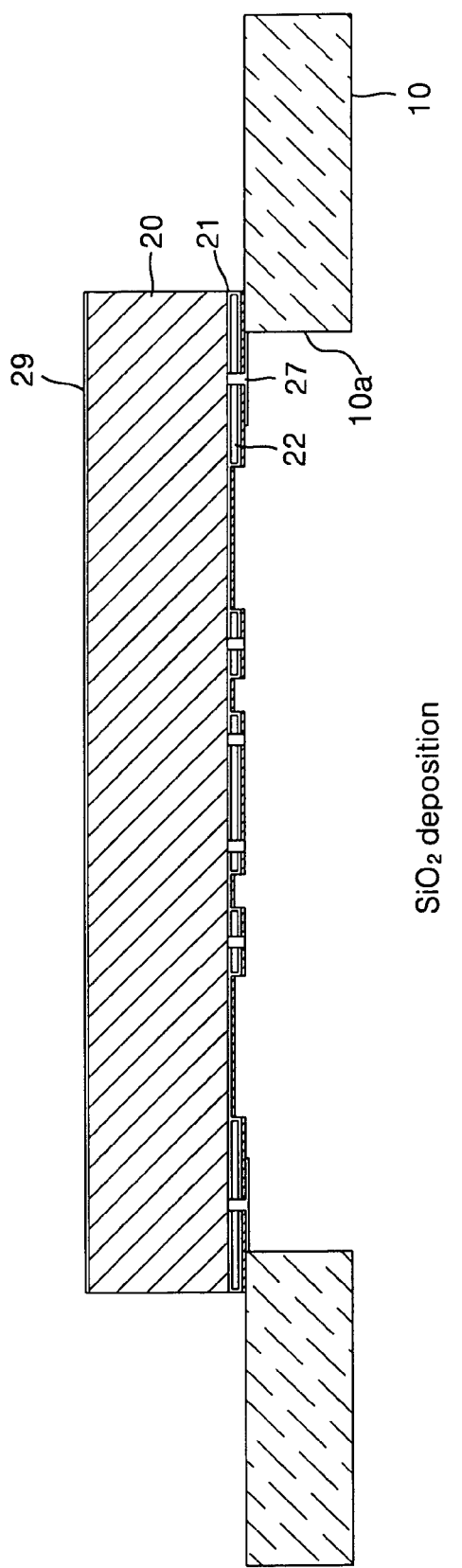

As shown in FIG. 13B, an SiO$_2$ insulation film 29 is deposited on the bottom surface 20a.

Figure 13C:
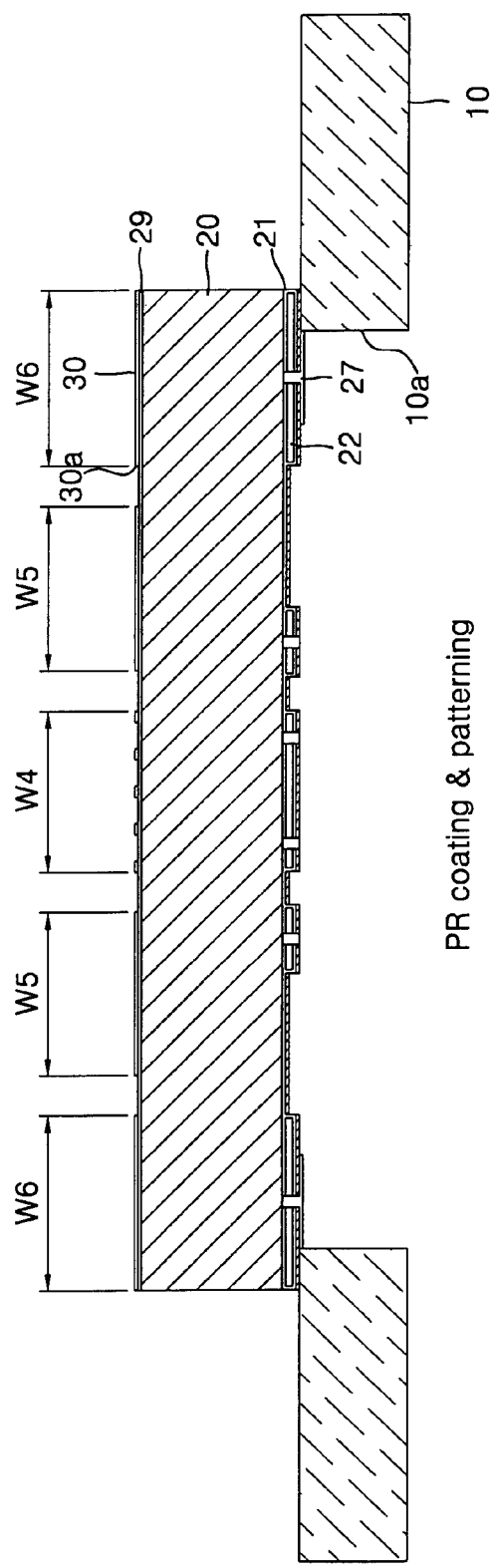

As shown in FIG. 13C, a photoresist mask 30 having a window 30a of a predetermined pattern is formed on the insulation film 29. The portion where the photoresist mask 30 remains corresponds to an area W4 where the first driving comb electrode 120 of the stage 100a is to be formed, an area W5 where the second driving comb electrode 410 is to be formed, and an area W6 where the stationary frame 300 is to be formed.

Figure 13D:
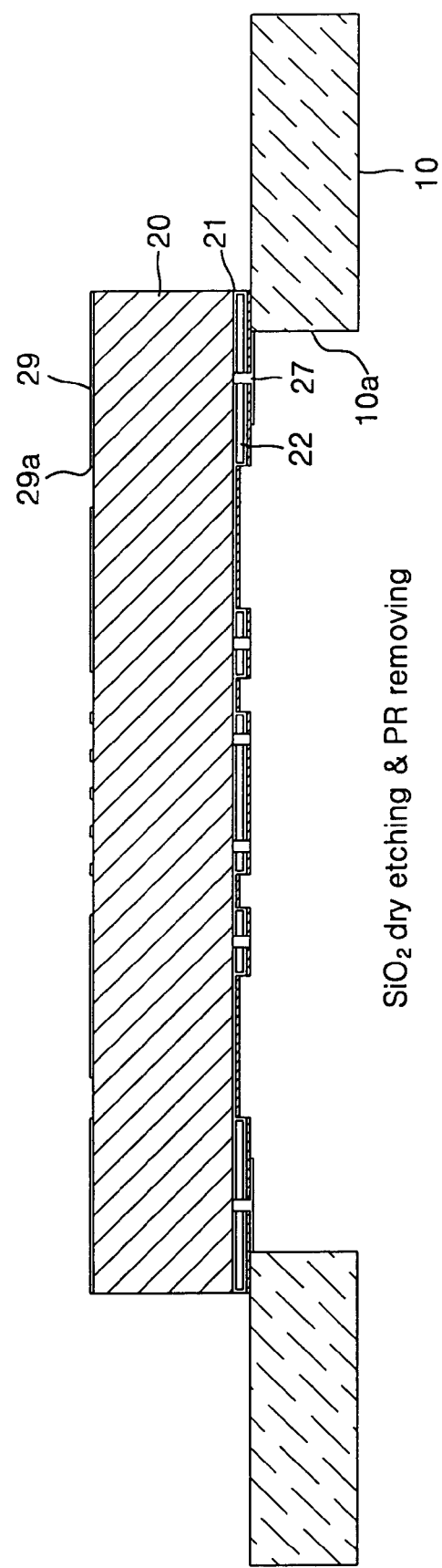

As shown in FIG. 13D, the exposed portion of the insulation film 29 which is not covered by the photoresist mask 30 is removed in a dry etching method. Next, the photoresist mask 30 is removed.

Figure 13E:
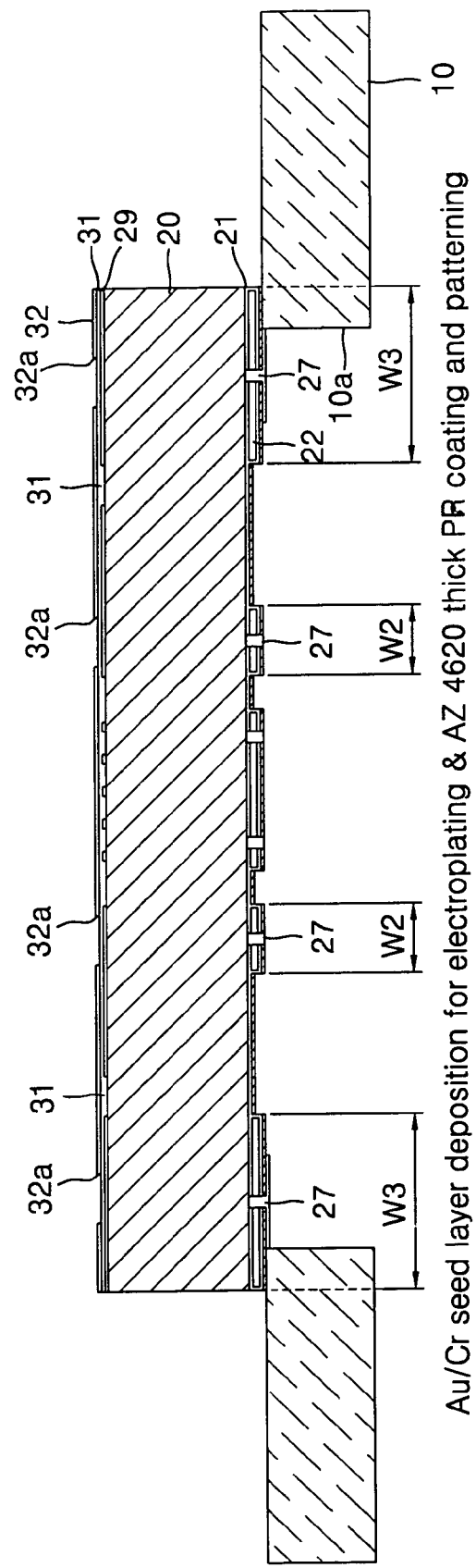

As shown in FIG. 13E, after an Au/Cr seed layer 31 is deposited on the entire surface of insulation film 29 a photoresist mask 32 having a window 32a of a predetermined pattern is formed thereon. The Au/Cr seed layer 31 can be obtained by depositing Cr on the insulation film 29 to a thickness of about 500 Å and Au threron to a thickness of about 1500–2000 Å. The window 32a is arranged corresponding to the through holes formed in the movable frame area W2 and the stationary frame area W3.

Figure 13F:
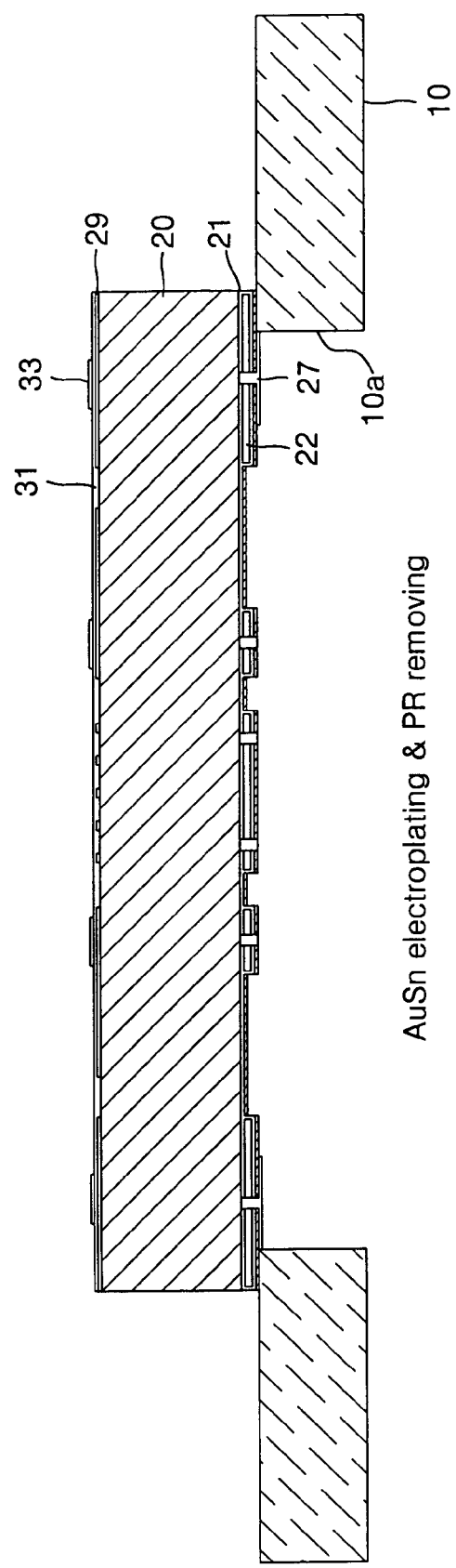

As shown in FIG. 13F, a conductive metal film, for example, an AuSn film 33, is formed in an electroplating method on a surface of the seed layer exposed through the window 32a and the photoresist mask 32 is removed. The AuSn film 33 is used as an eutectic bonding layer when the main body of the upper structure is coupled to the lower structure.

Figure 13G:
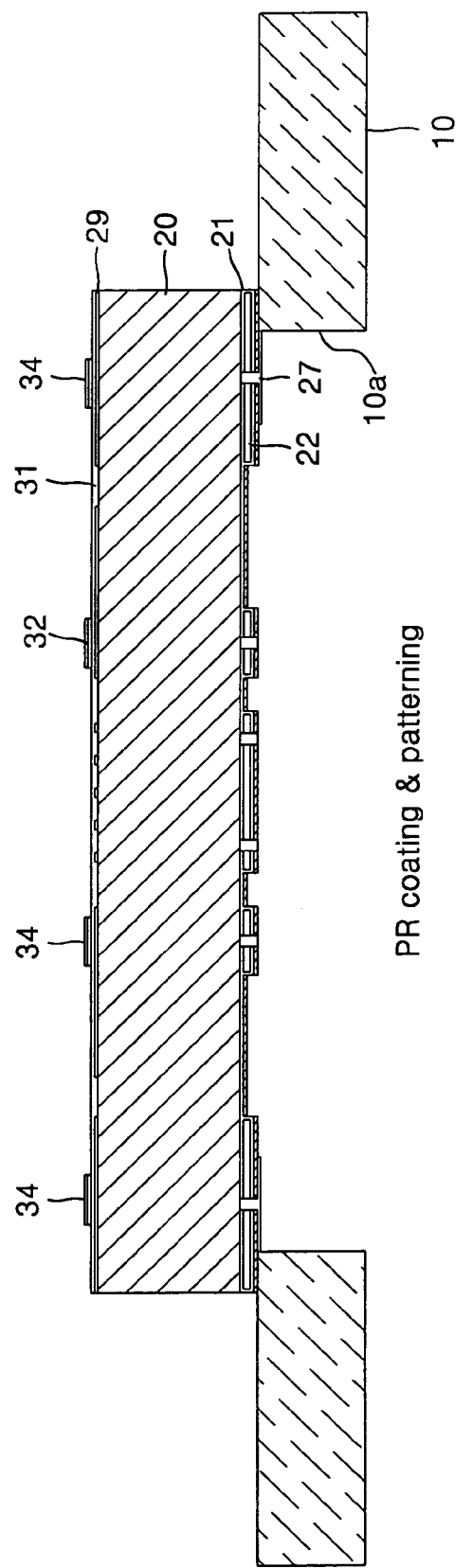

As shown in FIG. 13G, a photoresist mask 34 is formed on the AuSn film 33 by coating and patterning photoresist.

Figure 13H:
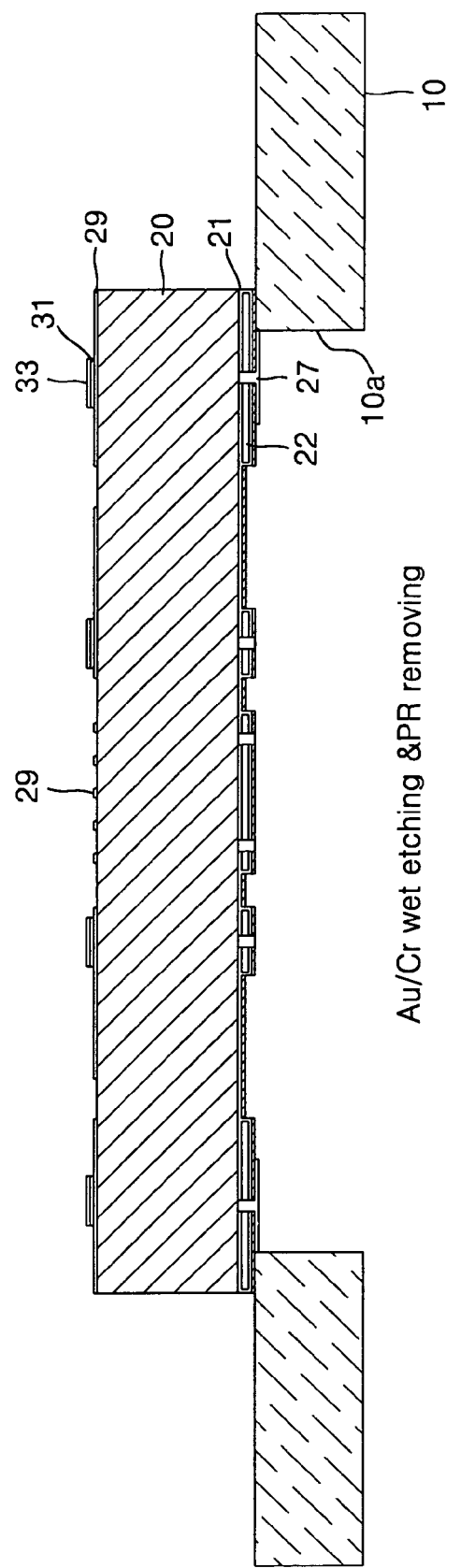

As shown in FIG. 13H, the Au/Cr seed layer 31 which is not covered by the photoresist mask 34 is etched by wet etching.

Figure 13I:
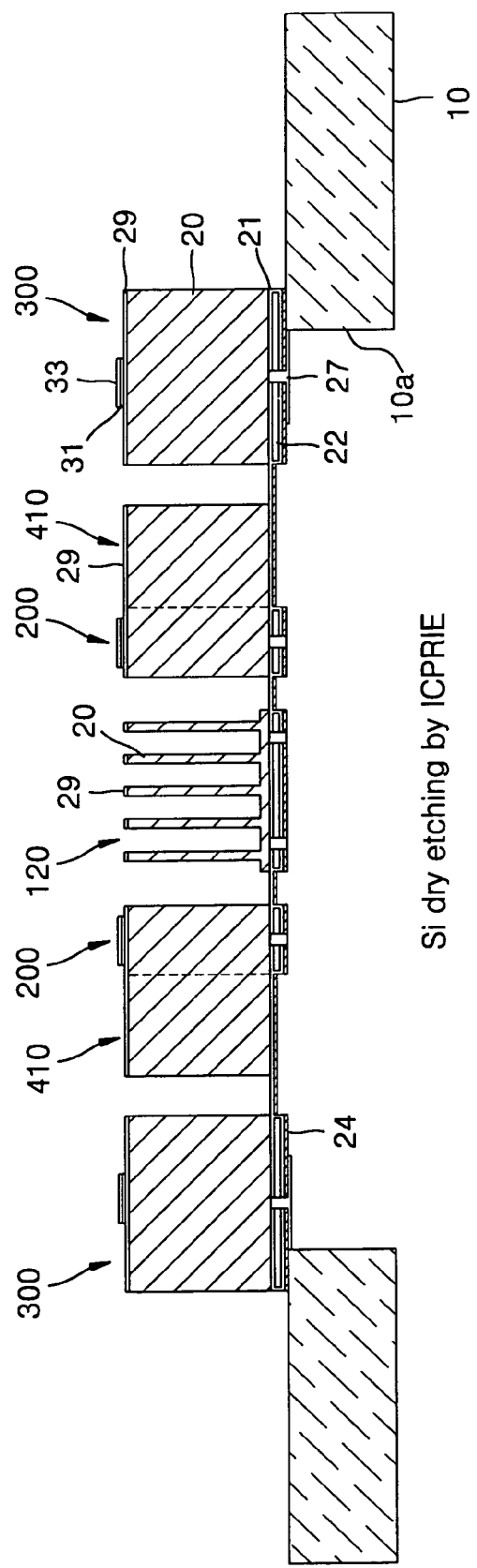

As shown in FIG. 13I, by etching a base material of the silicon main body 20 which is not covered by the AuSn film 33 and the SiO$_2$ insulation film 29 to a predetermined depth in an ICPRIE method, the first driving comb electrode 120 under the stage 100a (in the upper side of FIG. 13I), the movable frame 200 encompassing the stage 100a, and the second driving comb electrode 410 and the stationary frame 300 formed at the outer side surface of the movable frame 200 are formed separated from the base material of the silicon main body 20. Here, due to the properties of the ICPRIE method, etching is stopped at the SiO$_2$ insulation film 21 in the SOI structure.

Figure 13J:
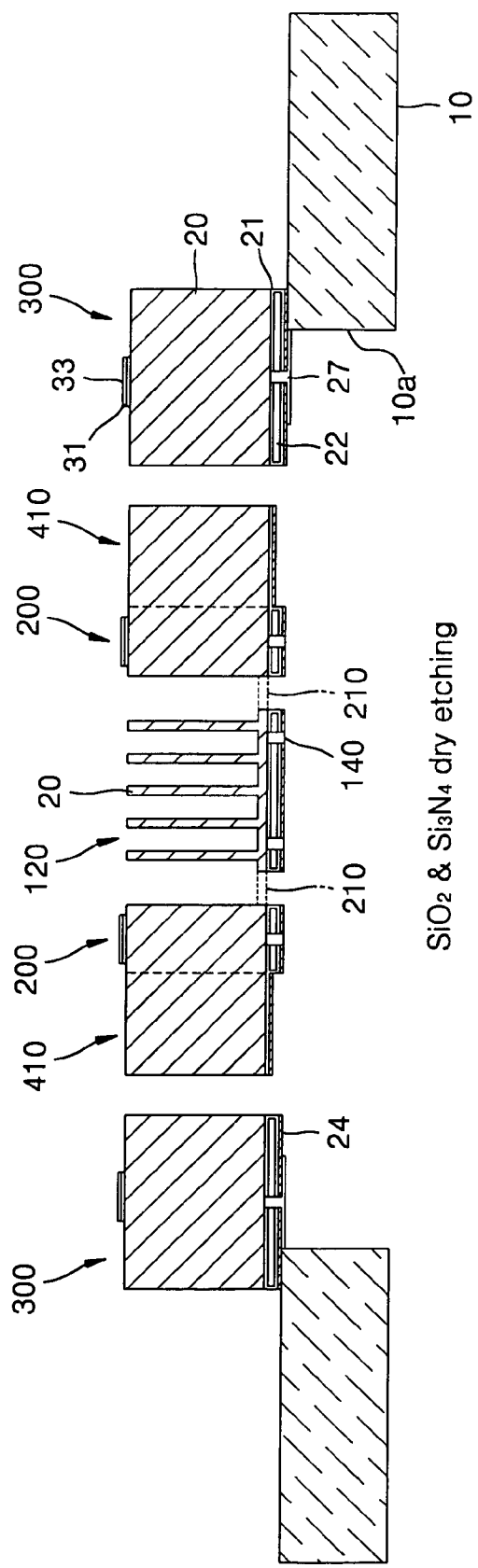

As shown in FIG. 13J, the SiO$_2$ insulation film 21 and the Si$_3$N$_4$ insulation film 24 remaining after the ICPRIE method is performed are penetrated so that the movable frame 200, the second driving comb electrode 410, and the stationary frame 300 are completely separated. As a result, the stage 100a and the movable frame 200 are connected by the first torsion bar 210 and the movable frame 200 and the stationary frame 300 are connected by the second torsion bar 310. Therefore, the upper structure applied to the actuator is completed.

Figure 13K:
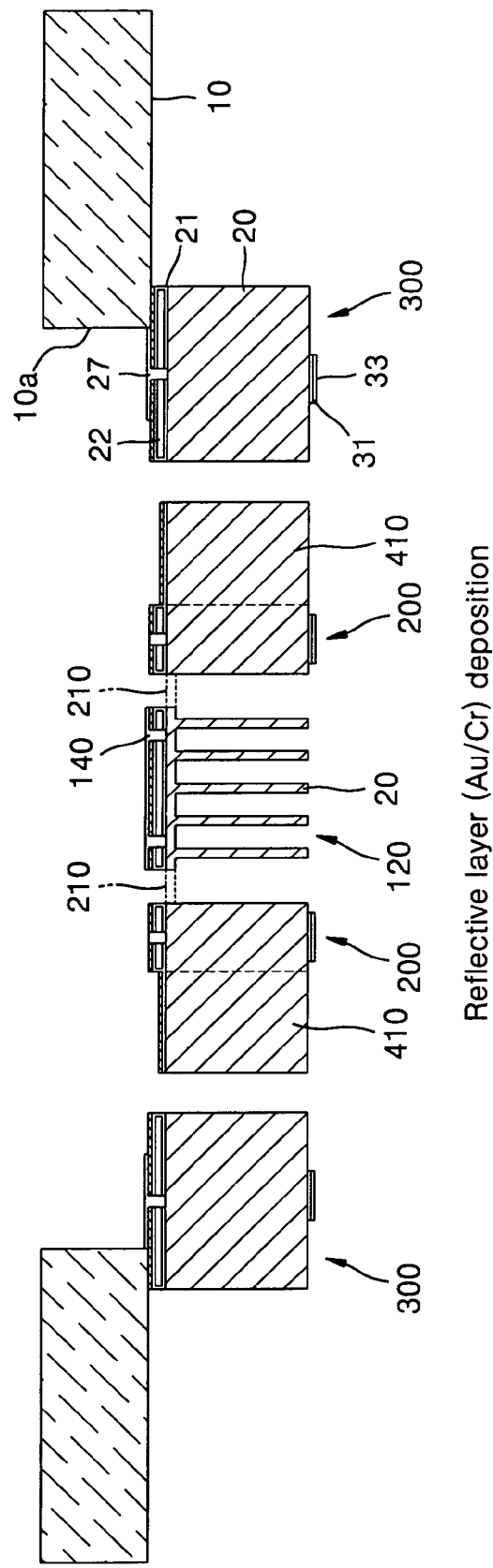

Referring to FIG. 13K, a reflection film 140 is formed by depositing a reflective material, for example, Au/Cr, on the upper surface of the stage 100a so that the upper structure is used as an optical scanner.

The above-described steps are focused on the manufacture of a single device. However, in general, the above device can be manufacture by a wafer unit process to obtain a plurality of devices with respect to a single wafer. An additional step may be accompanied during which the devices are collectively processed in the unit of a wafer. A dicing step to separate devices from the wafer is necessarily performed. Since the driving comb electrode may be damaged during the dicing step, a protective layer can be formed, prior to the dicing step, on the driving comb electrode to protect the driving comb electrode. After dicing is completed, the protective layer formed on the respective devices is finally removed. This additional step does not limit the scope of the present invention.

2. Lower Structure Manufacture Method

<<Manufacture of Lower Body of Lower Structure>>

Figure 14A:
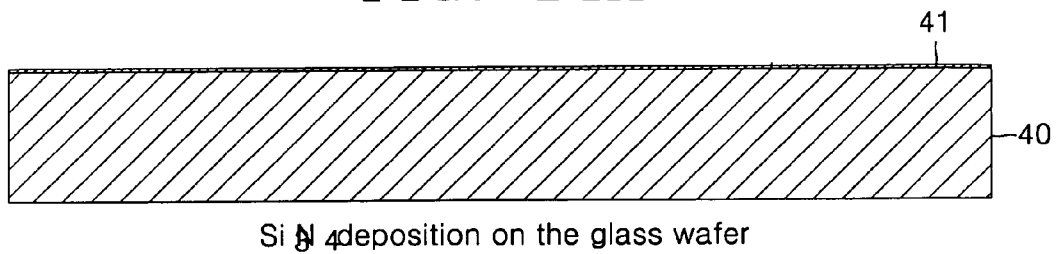
FIGS. 14A through 14E are views showing steps of processing a lower main body of a lower structure in a method of manufacturing the actuator according to the present invention.

As shown in FIG. 14A, a substrate 40 made of Pyrex glass and used as a support body of the lower structure in the actuator according to the present invention is prepared and an $Si_3N_4$ insulation film 41 is formed on the surface of the substrate 40.

Figure 14B:
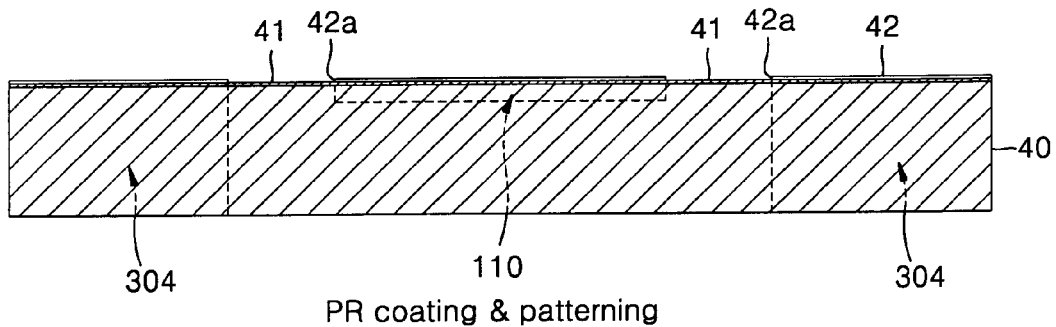

As shown in FIG. 14B, a photoresist mask 42 having a window 42a of a predetermined pattern is formed on the $Si_3N_4$ insulation film 41. The window 42a corresponds to a space between the movable frame 200 and the stationary frame 300 in the lower structure. The portion between the neighboring windows 42a is processed into the base 110 supporting the first stationary comb electrode 130 and the portions outside both windows 42a are processed into the lowermost multiple layer 304 of the stationary frame 300.

Figure 14C:
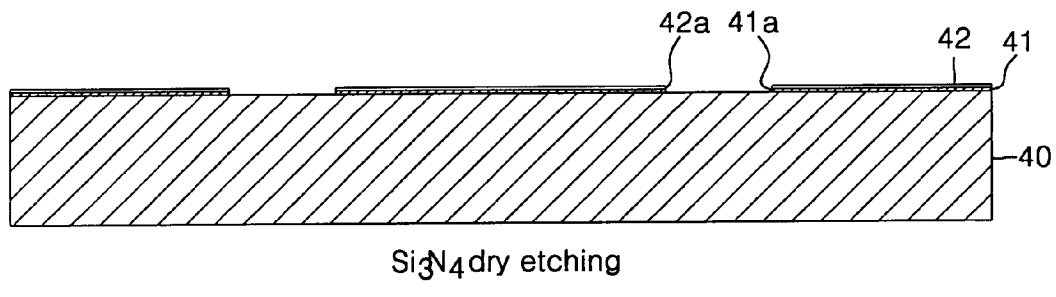

As shown in FIG. 14C, the exposed portion of the $Si_3N_4$ insulation film 41 which is not covered by the photoresist mask 42 is removed by dry etching.

Figure 14D:
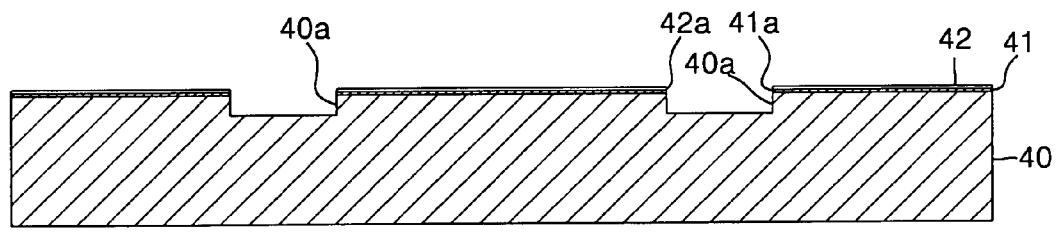

As shown in FIG. 14D, subsequent to the etching of the $Si_3N_4$ insulation film 41, the exposed portion of the substrate 40 is etched by wet etching to form a well 40a having a predetermined depth.

Figure 14E:
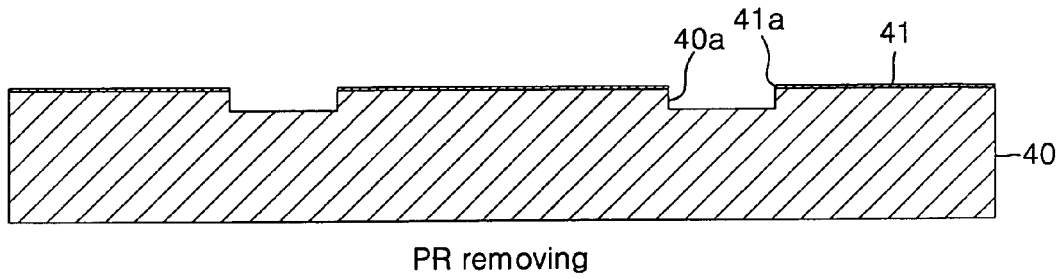

As shown in FIG. 14E, by removing the photoresist mask 42, a lower body of a semi-processed lower structure is obtained.

<<Manufacture of Upper Body of Lower Structure>>

Figure 15A:
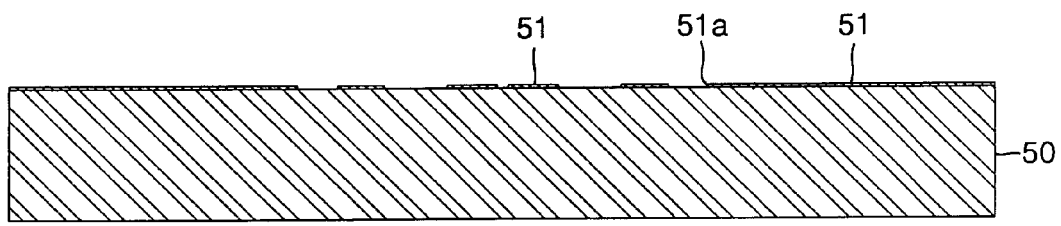
FIGS. 15A and 15B are views showing steps of processing an upper body of a lower structure in a method of manufacturing the actuator according to the present invention.

As shown in FIG. 15A, a silicon substrate 50 is prepared and a photoresist mask 51 having a window 51a of a predetermined pattern is formed on the surface of the silicon substrate 50.

The window 51a is formed corresponding to portions to be removed such as a boundary area between the first stationary comb electrodes separated into two parts in the lower structure, a boundary area between the movable frame and the stationary frame, and a boundary area between the second stationary comb electrode and the movable frame in the stationary frame.

Figure 15B:
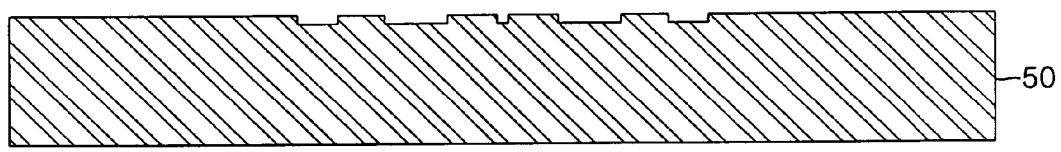

As shown in FIG. 15B, the surface of the silicon substrate 50 which is not covered by the photoresist mask 51 is etched to a predetermined depth and the photoresist mask 51 is removed, so that an upper body of a semi-processed lower structure is obtained.

<<Bonding of Upper and Lower Bodies of Lower Structure and Subsequent Steps>>

Figure 16A:
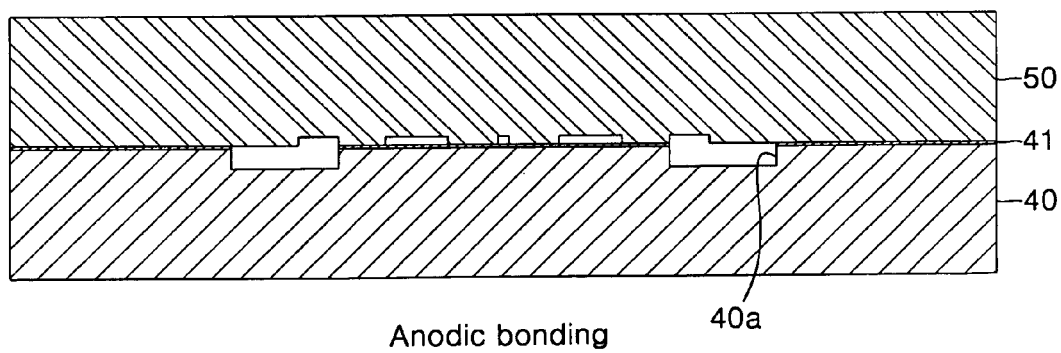
FIGS. 16A through 16O are views showing subsequent steps after the upper body and the lower body of the lower structure are coupled in a method of manufacturing the actuator according to the present invention.

As shown in FIG. 16A, processing surfaces of the upper and lower bodies of the lower structure are bonded by anodic bonding to face each other.

Figure 16B:
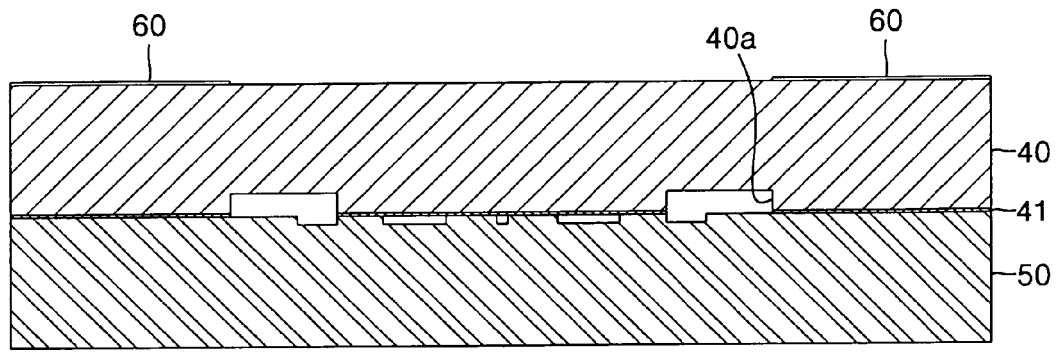

As shown in FIG. 16B, a mask 60 is formed using a DFR film on one exposed side surface (the upper surface on the drawing) of the substrate 40 such as a glass substrate. The portion covered by the mask 60 is to be processed into the lowermost multiple layer 304 of the stationary frame 300.

Figure 16C:
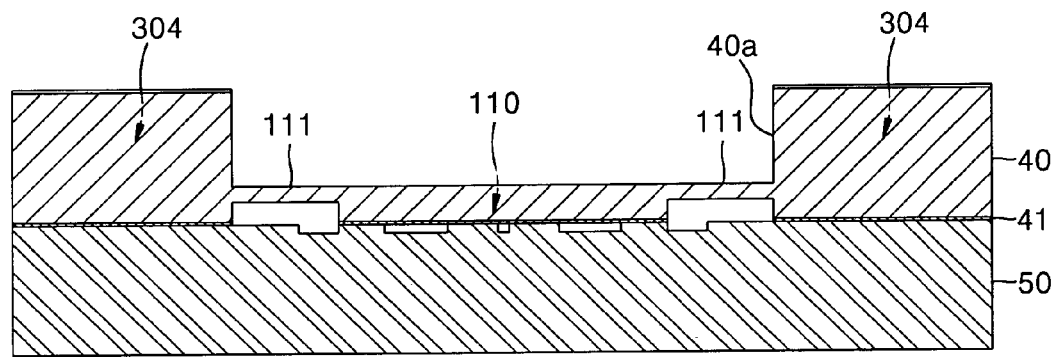

As shown in FIG. 16C, the glass substrate 40 is etched to a predetermined depth by sand blasting so that the base 110 in an initial form supporting the first stationary comb electrode and the lowermost multiple layer 304 of the stationary frame 300. The base 110 and the lowermost multiple layer 304 are connected by a temporary connection portion 111. The temporary connection portion 111 will be removed as the thickness of the base 110 decreases due to etching performed later.

Figure 16D:
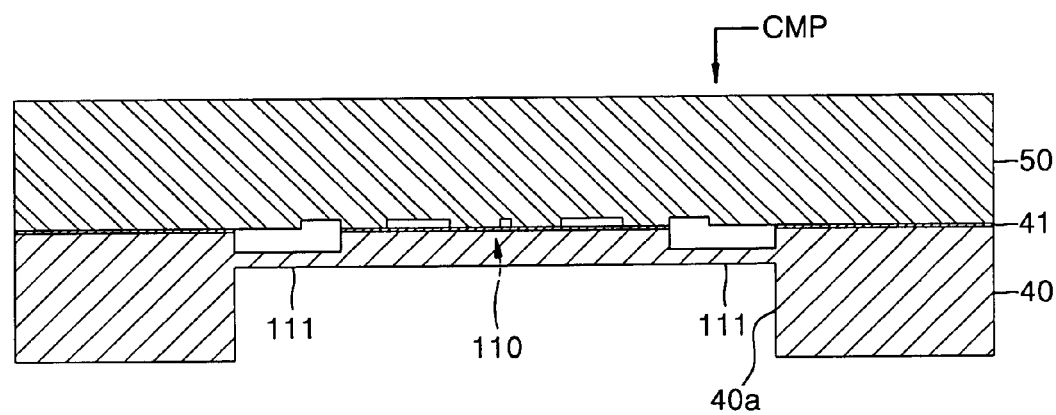

As shown in FIG. 16D, the DFR mask 60 is removed and the outer surface (the upper surface on the drawing) of the substrate 50 is grinded by the CMP method.

Figure 16E:
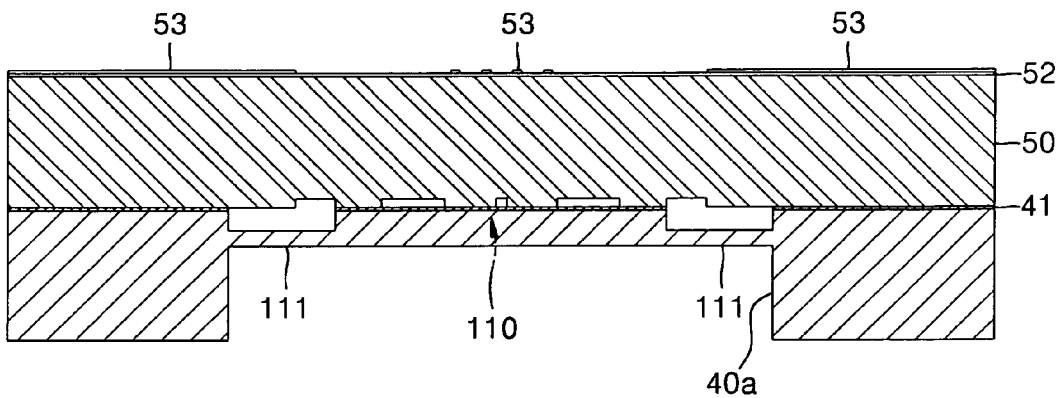

As shown in FIG. 16E, after an $SiO_2$ insulation film 52 is deposited on the exposed surface of the substrate 50 which is CMP processed, a photoresist mask 53 having a predetermined pattern is formed on the $SiO_2$ insulation film 52. The photoresist mask 53 has a pattern corresponding to the first stationary comb electrode on the base 110, the multiple layer 303 of the stationary frame 300, and the second stationary comb electrode 420 extending therefrom.

Figure 16F:
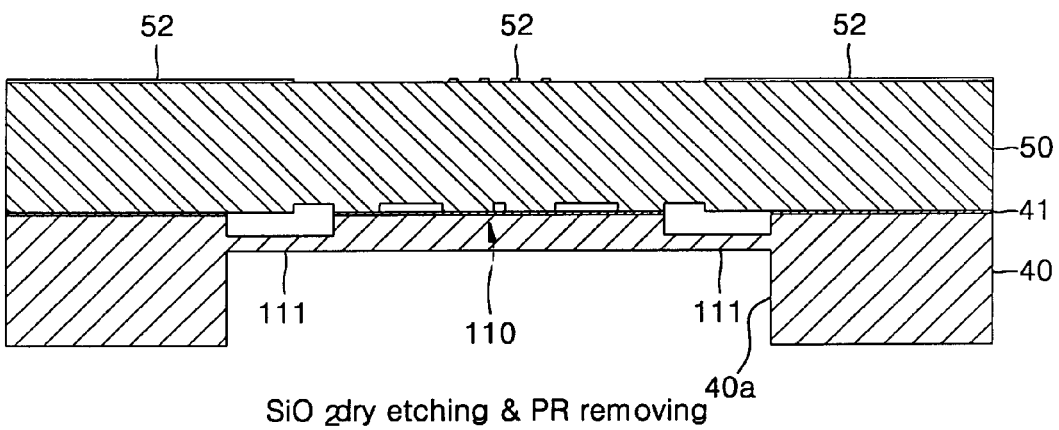

As shown in FIG. 16F, the exposed portion of the $SiO_2$ insulation film 52 which is not covered by the photoresist mask 53 is etched and the photoresist mask 53 is removed.

Figure 16G:
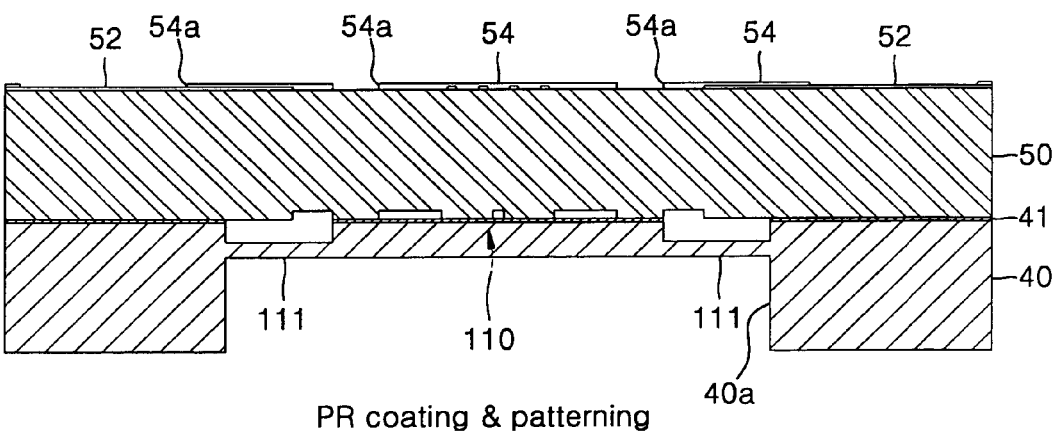

As shown in FIG. 16G, a photoresist mask 54 is formed on the $SiO_2$ insulation film 52 patterned in the above step. The photoresist mask 54 has a window 54a to etch the $SiO_2$ insulation film 52 and the silicon substrate 50 thereunder for physical and electric connection with the upper layer 301 of the stationary frame and the upper layer 201 of the movable frame obtained from the upper structure (refer to FIG. 16H).

Figure 16H:
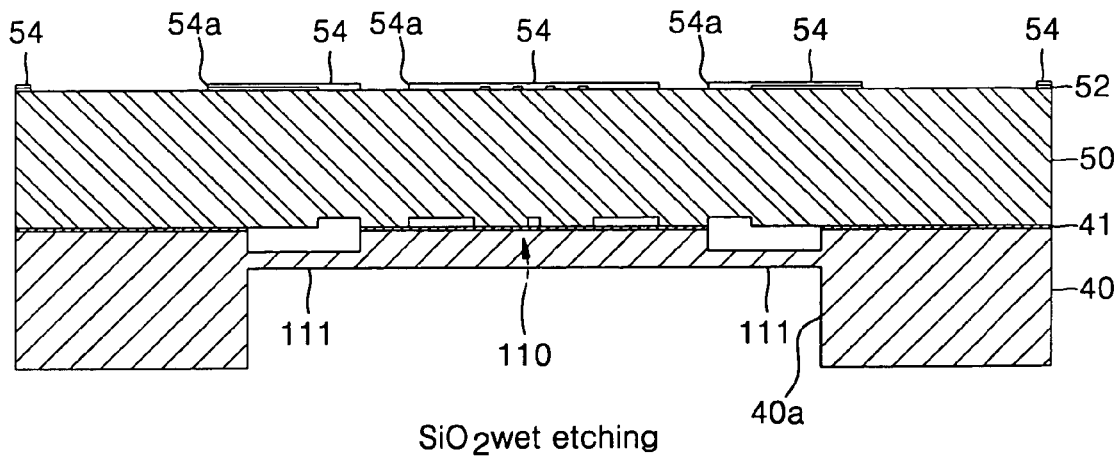
Figure 16I:
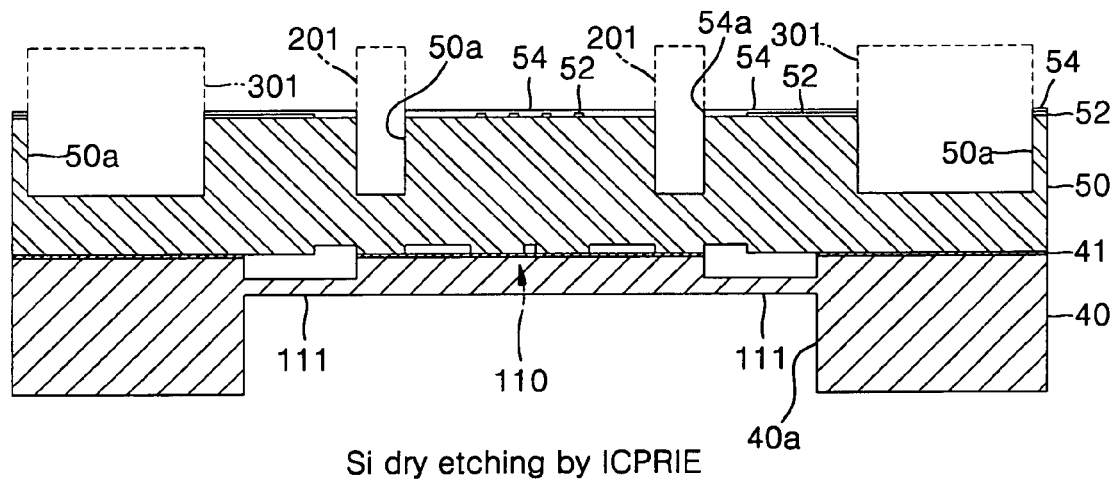

As shown in FIG. 16H, after the $SiO_2$ insulation film 52 covered by the mask 54 is removed by wet etching, as shown in FIG. 16I, the silicon substrate 50 is etched to a predetermined depth by ICPRIE to form a well 50a corresponding to a give pattern.

Figure 16J:
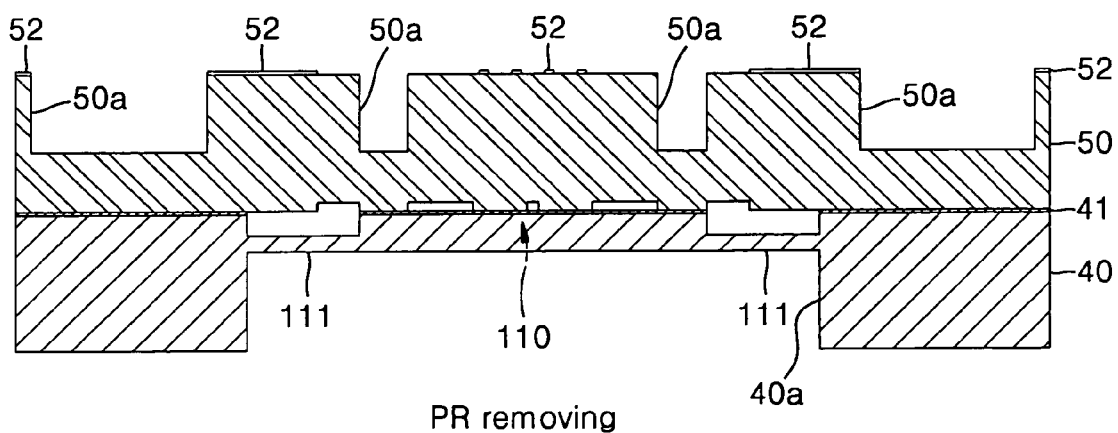
Figure 16K:
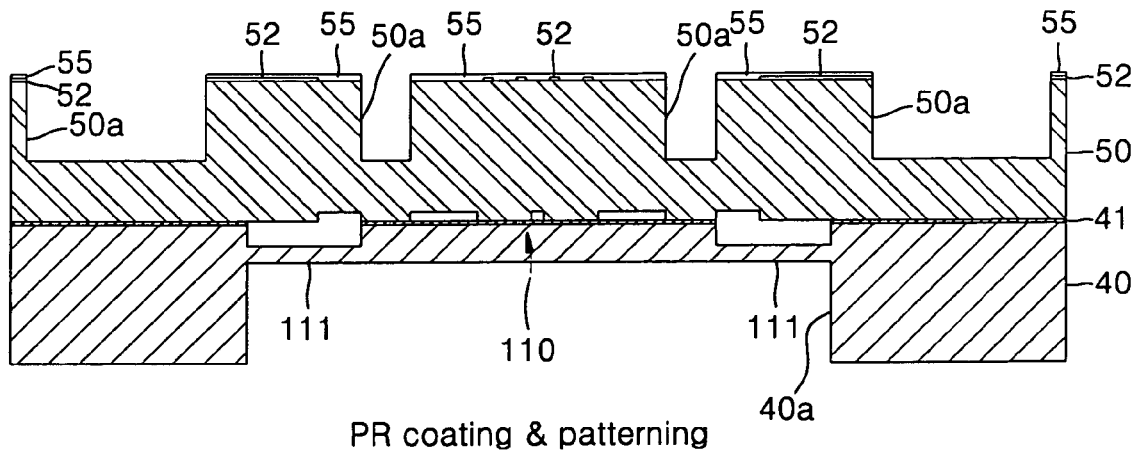

As shown in FIG. 16J, after the photoresist mask 54 is removed, as shown in FIG.16K, a photoresist sacrificial layer 55 is formed on the uppermost surface of the silicon substrate 50 except for the well 50a formed by etching in the preceding step.

Figure 16L:
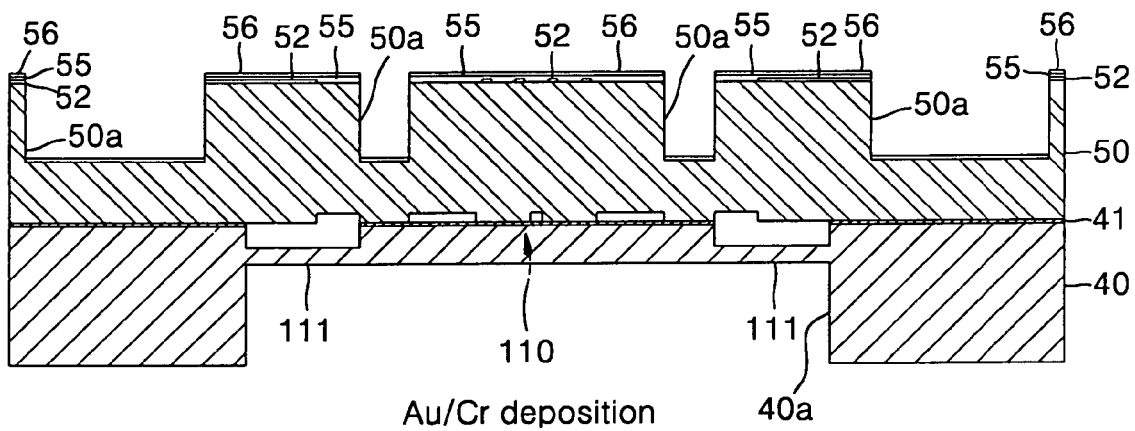
Figure 16M:
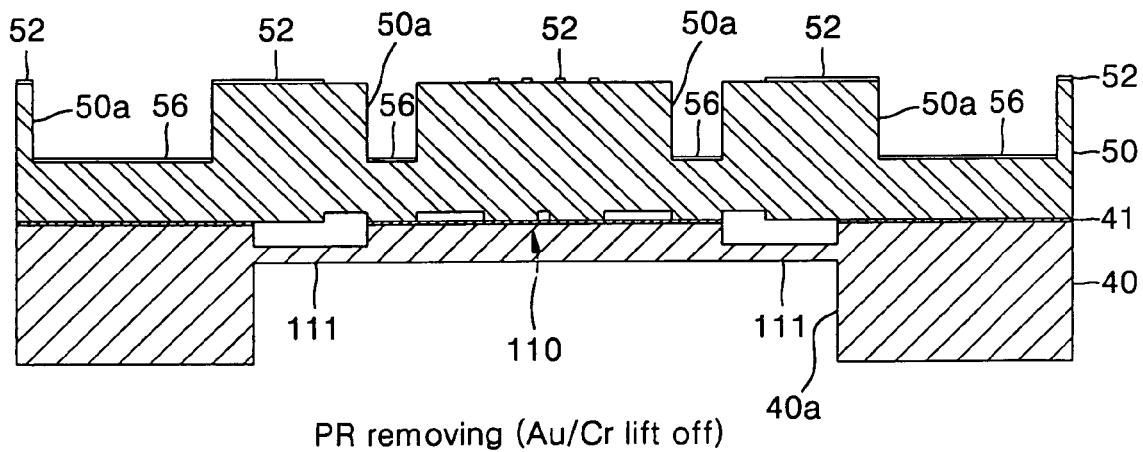

As shown in FIG. 16L, after An/Cr is deposited on the entire surface of the silicon substrate 50 to form a metal film 56, as shown in FIG. 16M, the sacrificial layer 55 is removed so that the metal film 56 remains on the bottom of the well 50a.

Figure 16N:
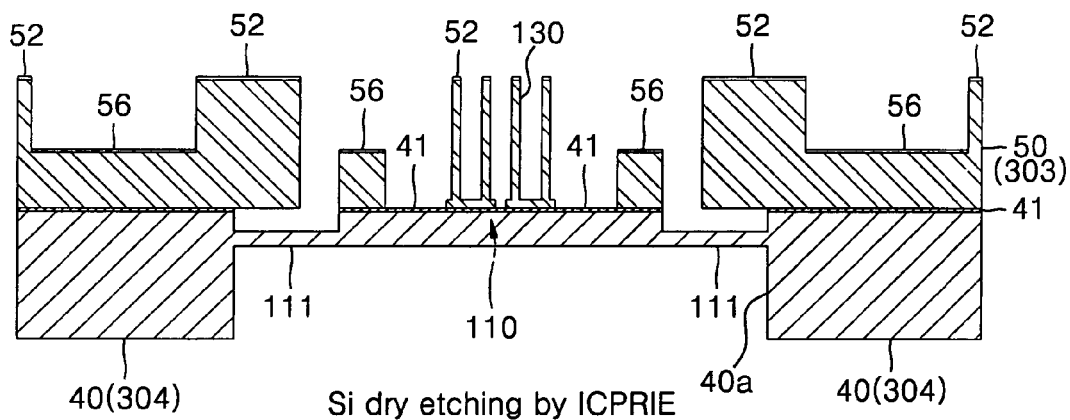
Figure 16O:
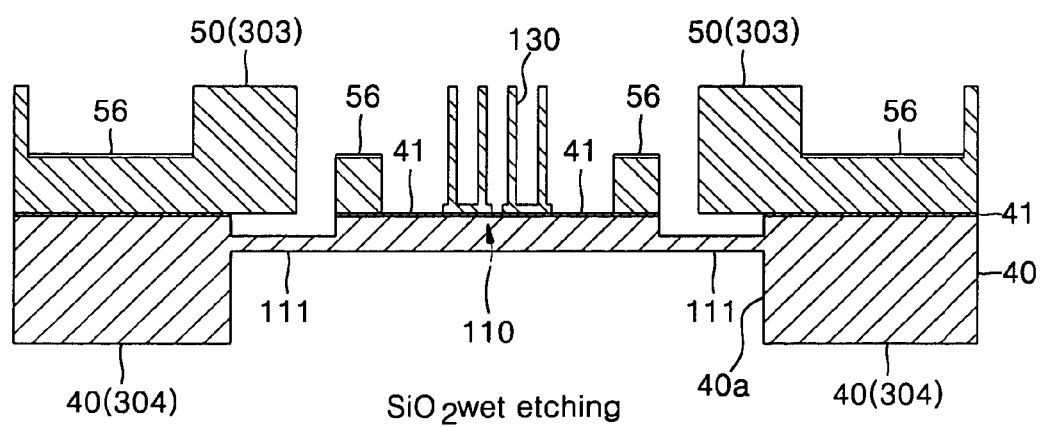

As shown in FIG. 16N, a portion which is not covered by the metal film 56 and the $SiO_2$ insulation film 52 is etched to form the first stationary comb electrode 130 and the second stationary comb electrode 420. All components except for the temporary connection portion 111 connecting the base 110 and the lower layer 304 of the stationary frame 300 in the lower structure are actually completed.

3. Assembling of Upper and Lower Structures and Subsequent Process

The upper and lower structures obtained from the above processes are coupled into one and a final actuator is completed.

Figure 17A:
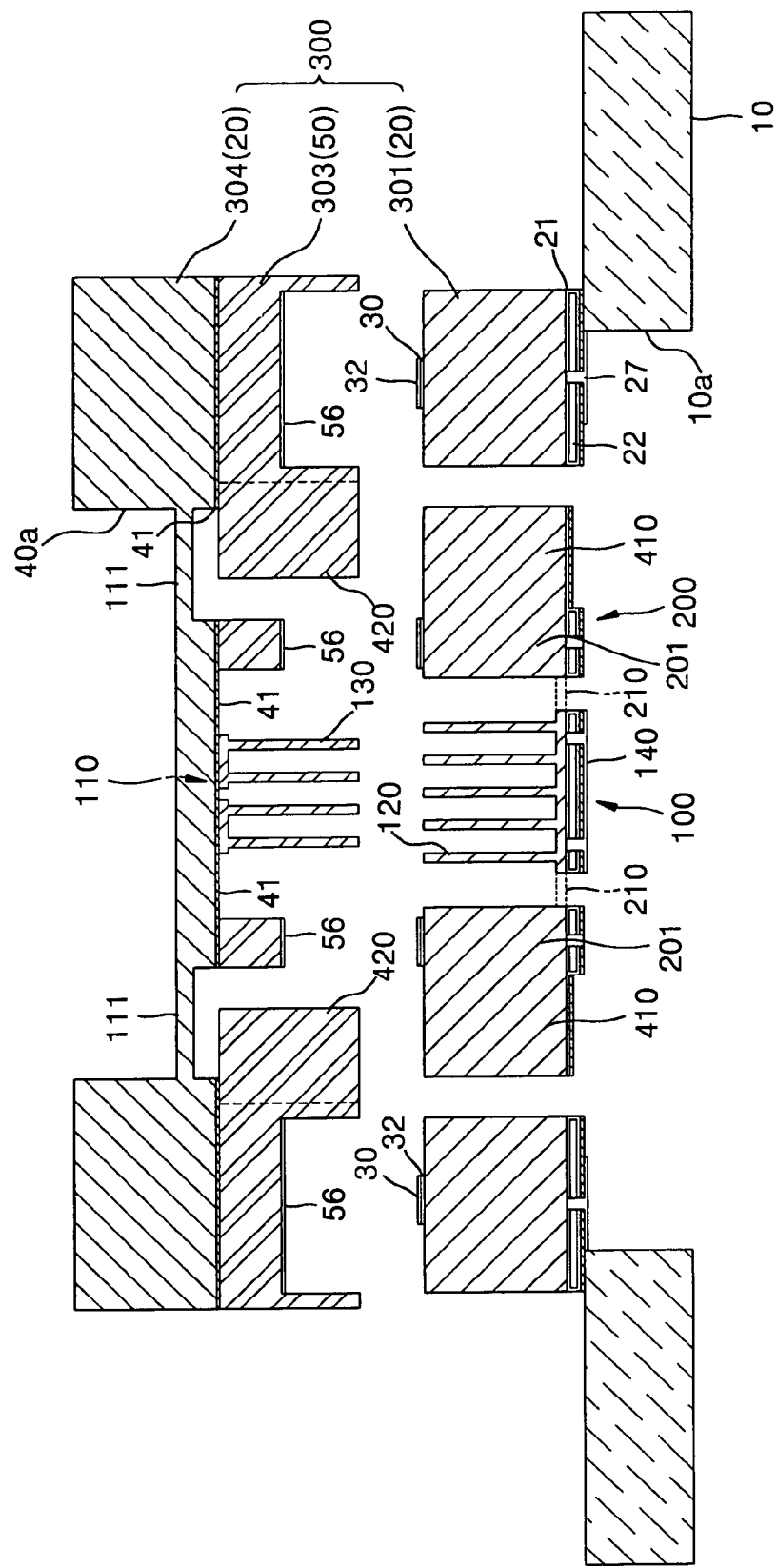
FIGS. 17A and 17B are views showing steps of coupling and completing the lower structure and the upper structure of the actuator in a method of manufacturing the actuator according to the present invention.
Figure 17B:
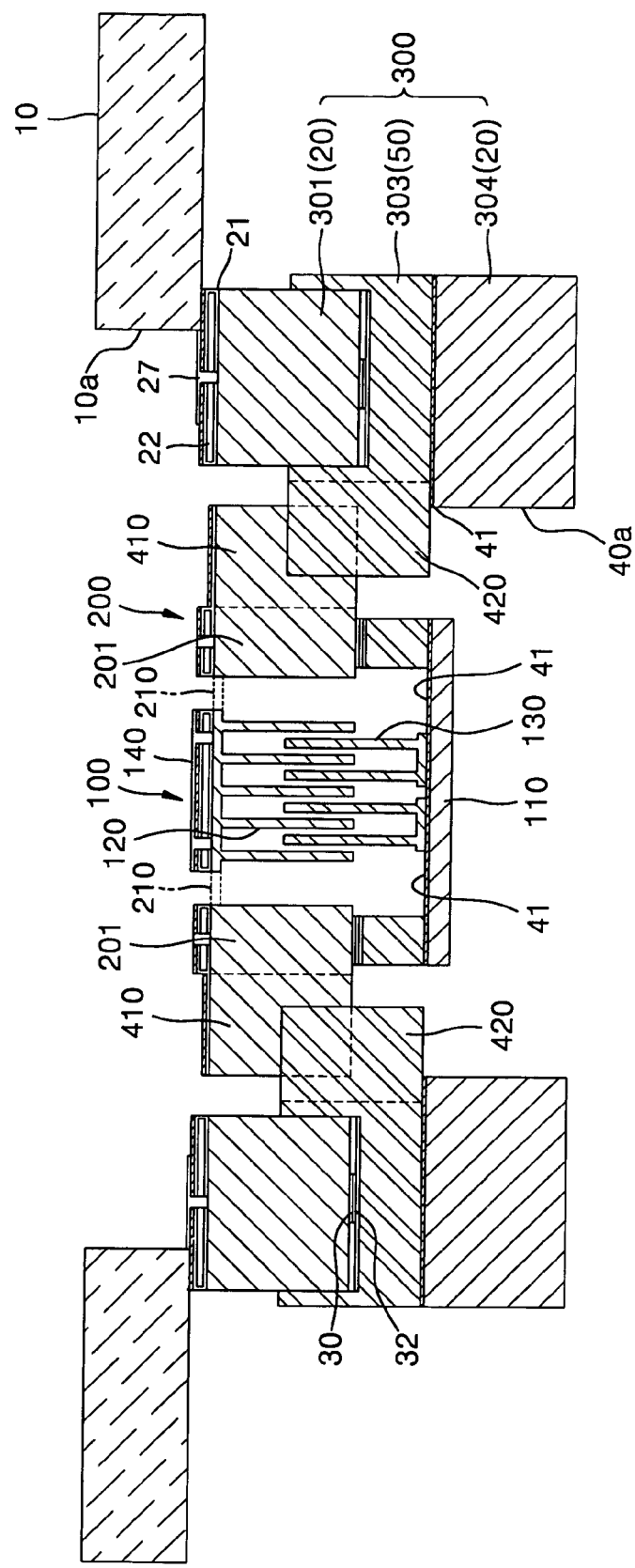

As shown in FIG. 17A, the upper and lower structures completed by the above-described processes are aligned by an appropriate Assembling apparatus. As shown in FIG. 17B, the upper and lower structures are Assembled into one by eutectic bonding. A desired actuator is completed by removing the temporary connection portion 111 connecting the base 110 and the stationary frame 300. For example, after the upper and lower structures are fixed by two vacuum chucks (the upper portion of both frames of the upper structure is fixed by a vacuum chuck and the center portion of the lower structure is fixed by a vacuum chuck), two structures are aligned while being observed through a microscope. When the alignment is completed, two vacuum chucks are made to approach each other to assemble the two upper and lower structures into one. Here, when a predetermined pressure and eutectic temperature are maintained, the metal eutectic bonding layer between the frames is melt to bond the upper and lower structures into one.

As described above, in the actuator according to a preferred embodiment of the present invention, since the stationary comb electrode and the driving comb electrode for driving the stage are formed under the stage and the driving comb electrode and the stationary comb electrode overlap in a direction of driving the stage, an efficient arrangement of the driving comb electrodes for driving the stage is possible and a high speed driving is possible while a large are of a reflection surface is possible due to the arrangement. Also, the linear driving of a reflection surface is possible in the overall operation period. Furthermore, since the actuator according to the present invention has a structure of forming an asymmetrical electric field in a driving direction, an initial starting is possible without a starting electrode as in the conventional actuator and electric separation and control is available.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. An actuator comprising:
   a stage having a first direction and a second direction perpendicular to the first direction and seesawing around a third direction perpendicular to the first direction and the second direction with respect to a rotation center axis placed along the first direction;
   a first support portion supporting a seesaw motion of the stage;
   a base facing the stage under the stage at a predetermined interval and supported by the first support portion;
   a stage driving portion having a plurality of first driving comb electrodes and a plurality of first stationary comb electrodes corresponding to the first driving comb electrodes which are respectively formed on a lower surface of each of the stages and an upper surface of the base facing the stages;
   a second support portion supporting the first support portion so that the first support portion seesaws with respect to a rotation center axis placed along the second direction; and
   a first support portion driving portion having a second driving comb electrode provided at the first support portion and a second stationary comb electrode fixedly positioned to correspond to the second driving comb electrode to generate a seesaw motion of the first support portion.

2. The actuator as claimed in claim 1, wherein the first support portion comprises:
   a pair of first torsion bars respectively extending from both sides of the stage in the first direction and parallel to each other; and
   a rectangular edge type movable frame having a pair of first portions parallel to each other, to which the first torsion bars are connected, and a pair of second portions extending in the second direction and parallel to each other.

3. The actuator as claimed in claim 2, wherein the second support portion comprises:
   a pair of second torsion bars respectively extending from the second portion of the first support portion in the second direction; and
   a rectangular edge type stationary frame having a pair of second portions parallel to each other, to which the second torsion bars are connected, and a pair of first portions extending in the second direction and parallel to each other.

4. The actuator as claimed in claim 3, wherein the stationary frame comprises a first portion stationary frame and a second portion stationary frame at a lower portion of the first portion stationary frame, and the second stationary comb electrode corresponding to the second driving comb electrode extends from the first portion stationary frame.

5. The actuator as claimed in claim 2, wherein the movable frame includes the second portion movable frame at the base's side and the first portion movable frame above the second portion movable frame.

6. The actuator as claimed in claim 5, wherein the second driving comb electrode extends from the first portion movable frame.

7. The actuator as claimed in claim 2, wherein the first torsion bars are integrally formed with the stage and the first portion movable frame, and the second torsion bars are integrally formed with the movable frame and the first portion stationary frame.

8. The actuator as claimed in claim 1, wherein the second support portion comprises:
   a pair of second torsion bars respectively extending from the second portion of the first support portion in the second direction; and
   a rectangular edge type stationary frame having a pair of first portions parallel to each other, to which the second torsion bars are connected, and a pair of second portions extending in the second direction and parallel to each other.

9. The actuator as claimed in claim 8, wherein the second driving comb electrode and the second stationary comb electrode are arranged deviating from each other in the third direction to form an asymmetrical electric field in the third direction.

10. The actuator as claimed in claim 1, wherein, in the stage driving portion, the first driving comb electrode formed on a lower surface of the stage and the first stationary comb electrode formed on the base are parallel to each other in the third direction and extend alternately.

11. The actuator as claimed in claim 10, wherein the first support portion driving portion comprises:
    a second driving comb electrode extending in the first direction from each of the first portion of the first support portion; and
    a stationary comb electrode formed on the first portion of the second support portion alternately arranged with the second driving comb electrode.

12. The actuator as claimed in claim 1, wherein the first support portion driving portion comprises:
    a second driving comb electrode extending in the first direction from each of the first portion of the first support portion; and
    a stationary comb electrode formed on the first portion of the second support portion alternately arranged with the second driving comb electrode.

13. An actuator comprising:
    a stage array in which a plurality of stages are arranged parallel to one another, the stage having a first direction and a second direction perpendicular to the first direction and seesawing around a third direction perpendicular to the first direction and the second direction with respect to a rotation center axis placed along the first direction;
    a first support portion supporting the stage array to enable a seesaw motion of each stage;
    a base facing the stages under the stage array at a predetermined internal and supported by a the first support portion;
    a stage driving portion having a first driving comb electrode and a first stationary comb electrode corresponding to the first driving comb electrode which are respectively formed on a lower surface of the stage and an upper surface of the base facing the stage;

a second support portion supporting the first support portion so that the first support portion seesaws with respect to a rotation center axis placed along the second direction; and a first support portion driving portion having a second driving comb electrode provided at the first support portion and a second stationary comb electrode fixedly positioned to correspond to the second driving comb electrode to generate a seesaw motion of the first support portion.

14. The actuator as claimed in claim 13, wherein the first support portion comprises:

a pair of first torsion bars respectively extending from both sides of the stage in the first direction parallel to each other; and a rectangular edge type movable frame having a pair of first portions parallel to each other, to which the first torsion bars are connected, and a pair of second portions extending in the second direction and parallel to each other.

15. The actuator as claimed in claim 14, wherein the second support portion comprises:

a pair of second torsion bars respectively extending from the second portion of the first support portion in the second direction; and a rectangular edge type stationary frame having a pair of second portions parallel to each other, to which the second torsion bars are connected, and a pair of first portions extending in the second direction and parallel to each other.

16. The actuator as claimed in claim 15, wherein the stationary frame comprises a first portion stationary frame and a second portion stationary frame at a lower portion of the first portion stationary frame, and the second stationary comb electrode corresponding to the second driving comb electrode extends from the first portion stationary frame.

17. The actuator as claimed in claim 14, wherein the movable frame includes the second portion movable frame at the base's side and the first portion movable frame above the second portion movable frame.

18. The actuator as claimed in claim 17, wherein the second driving comb electrode extends from the first portion movable frame.

19. The actuator as claimed in claim 14, wherein the first torsion bars are integrally formed with the stage and the first portion movable frame, and the second torsion bars are integrally formed with the movable frame and the first portion stationary frame.

20. The actuator as claimed in claim 13, wherein the second support portion comprises:

a pair of second torsion bars respectively extending from the second portion of the first support portion in the second direction; and a rectangular edge type stationary frame having a pair of first portions parallel to each other, to which the second torsion bars are connected, and a pair of second portions extending in the second direction and parallel to each other.

21. The actuator as claimed in claim 20, wherein the second driving comb electrode and the second stationary comb electrode are arranged deviating from each other in the third direction to form an asymmetrical electric field in the third direction.

22. The actuator as claimed in claim 13, wherein, in the stage driving portion, the first driving comb electrode formed on a lower surface of the stage and the first stationary comb electrode formed on the base are parallel to each other in the third direction and extend alternately.

23. The actuator as claimed in claim 22, wherein the first support portion driving portion comprises:

a second driving comb electrode extending in the first direction from each of the first portion of the first support portion; and a stationary comb electrode formed on the first portion of the second support portion alternately arranged with the second driving comb electrode.

24. The actuator as claimed in claim 13, wherein the first support portion driving portion comprises:

a second driving comb electrode extending in the first direction from each of the first portion of the first support portion; and a stationary comb electrode formed on the first portion of the second support portion alternately arranged with the second driving comb electrode.

25. A method of manufacturing an actuator comprising the steps of:

forming an upper structure comprising a stage having a first driving comb electrode formed on a lower surface of the stage in a vertical direction, a first portion movable frame encompassing the stage with a first separation area having a predetermined width, a first portion stationary frame encompassing the first portion movable frame with a second separation area having a predetermined width, a torsion bar extending from both end sides of the stage and connected to the first portion movable frame, a second torsion bar extending from the first portion movable frame in the second direction and connected to the first portion stationary frame, and a plurality of second driving comb electrodes extending from the first portion movable frame in the first direction and disposed in the second separation area;

forming a lower structure comprising a stage corresponding to the stage, a second portion movable frame supporting the base and corresponding to the first portion movable frame, a first stationary comb electrode formed on the base and corresponding to the first driving comb electrode of the stage, a second portion stationary frame corresponding to the first portion stationary frame, a plurality of second stationary comb electrodes extending from the second portion stationary frame to the second separation area in the first direction, parallel to one another, and a temporary connection portion in the second separation area temporarily connecting the second portion movable frame and the second portion stationary frame;

forming the first portion movable frame and the second portion movable frame, and the first portion stationary frame and the second portion stationary frame, contact each other and bonding the same; and separating a movable frame by removing the temporary connection portion so that the movable frame formed by the first portion movable frame and the second portion movable frame is suspended by the second torsion bar at a stationary frame formed by the first portion stationary frame and the second portion stationary frame.

26. The method as claimed in claim 25, wherein the first portion movable frame and the second portion movable frame, and the first portion stationary frame and the second portion stationary frame, are respectively bonded by eutectic bonding.

27. The method as claimed in claim 25, wherein, in the upper structure forming step, the first driving comb electrode and the second driving comb electrode of the movable frame are formed on the lower surface of the stage in a vertical direction.

28. The method as claimed in claim 25, wherein, in the lower structure forming step, the first stationary comb electrode corresponding to the first driving comb electrode on the lower surface of the stage and the second stationary comb electrode corresponding to the second driving comb electrode are formed on an upper surface of the substrate.

* * * * *